US011171089B2

(12) United States Patent
Peng et al.

(10) Patent No.: US 11,171,089 B2
(45) Date of Patent: Nov. 9, 2021

(54) LINE SPACE, ROUTING AND PATTERNING METHODOLOGY

(71) Applicant: TAIWAN SEMICONDUCTOR MANUFACTURING COMPANY LTD., Hsinchu (TW)

(72) Inventors: Shih-Wei Peng, Hsinchu (TW); Chih-Ming Lai, Hsinchu (TW); Jiann-Tyng Tzeng, Hsinchu (TW); Wei-Cheng Lin, Taichung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 16/653,501

(22) Filed: Oct. 15, 2019

(65) Prior Publication Data

US 2020/0135637 A1    Apr. 30, 2020

Related U.S. Application Data

(60) Provisional application No. 62/753,443, filed on Oct. 31, 2018.

(51) Int. Cl.
*H01L 23/528* (2006.01)
*H01L 21/00* (2006.01)
(Continued)

(52) U.S. Cl.
CPC .......... *H01L 23/528* (2013.01); *G06F 30/394* (2020.01); *H01L 21/31111* (2013.01); *H01L 21/76816* (2013.01); *H01L 21/76877* (2013.01)

(58) Field of Classification Search
CPC ...... G06F 30/394; G06F 30/392; G06F 30/39; G06F 30/398; G06F 30/3323;
(Continued)

(56) References Cited

U.S. PATENT DOCUMENTS 6,307,265 B1 * 10/2001 Anand ................ H01L 21/7682
257/758
6,958,542 B2 * 10/2005 Hasunuma ........ H01L 21/76832
257/750

(Continued)

OTHER PUBLICATIONS

Quirk "Semiconductor Manufacturing Technology" (2001, Prentice-Hall, Upper Seddle River, New Jersey, 07458, Chapter 16 ETCH, pp. 435-444; 454-455.*

*Primary Examiner* — Nikolay K Yushin
(74) *Attorney, Agent, or Firm* — Hauptman Ham, LLP

(57) ABSTRACT

A method of manufacturing a semiconductor device including the operations of defining a first metal pattern (MX-1) having a first metal pattern pitch (MX-$1_P$); depositing an insulating layer over the first metal pattern; defining a core grid having a plurality of core locations having a coreX pitch (CoreX$_P$) on the insulating layer; removing predetermined portions of the insulating layer to form a plurality of core openings through a predetermined set of the core locations; and elongating the core openings using a directional etch (DrE) to form expanded core openings that are used to form the next metal layer MX pattern.

20 Claims, 18 Drawing Sheets

(51) Int. Cl.
*H01L 21/768* (2006.01)
*H01L 21/311* (2006.01)
*G06F 30/394* (2020.01)

(58) Field of Classification Search
CPC .... G06F 30/17; G06F 30/00; H01L 21/31111; H01L 21/76816; H01L 21/76877; H01L 23/528; H01L 23/49822; H01L 23/488; H01L 23/66; H01L 23/3114
See application file for complete search history.

(56) References Cited

U.S. PATENT DOCUMENTS

| | | |
|---|---|---|
| 7,260,442 B2 | 8/2007 | Hwang et al. |
| 7,698,665 B2 * | 4/2010 | Abrams .................. G03F 1/68 716/55 |
| 9,256,709 B2 | 2/2016 | Yu et al. |
| 2014/0040838 A1 | 2/2014 | Liu et al. |
| 2015/0278429 A1 | 10/2015 | Chang |
| 2019/0148145 A1 | 5/2019 | Huang et al. |

\* cited by examiner

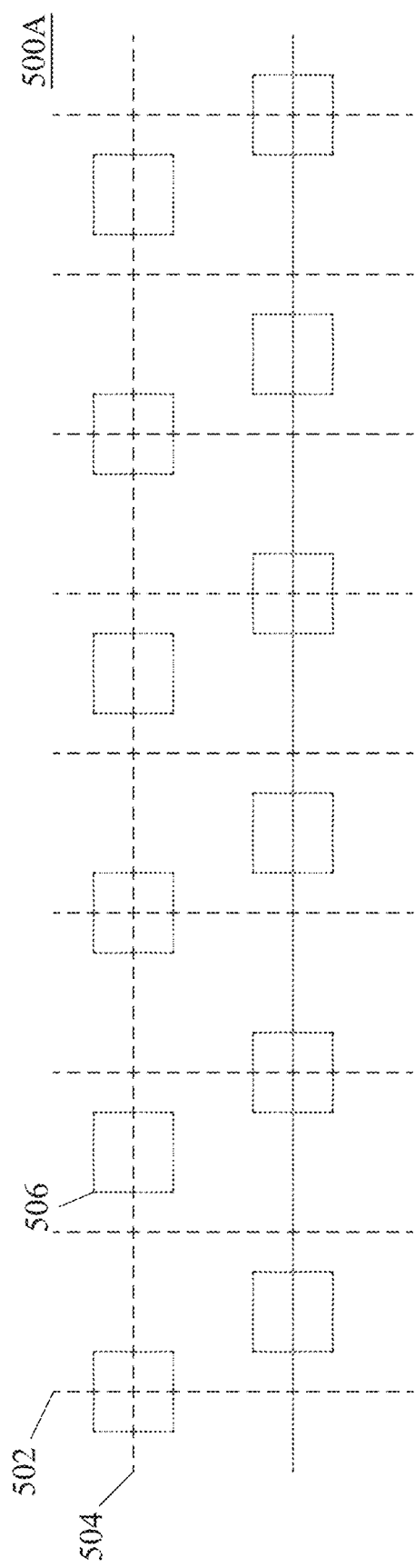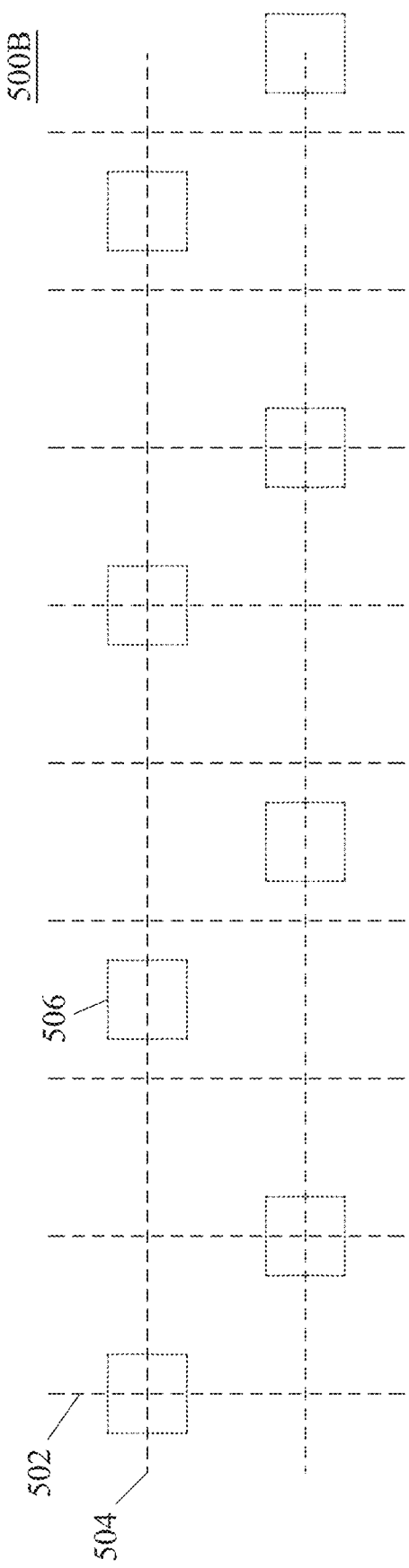

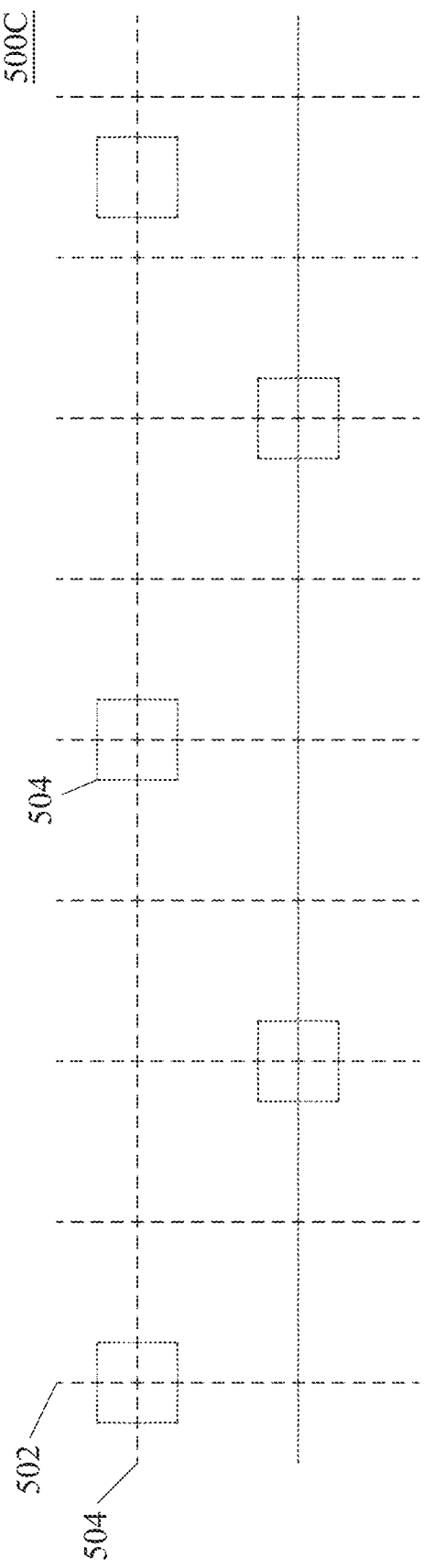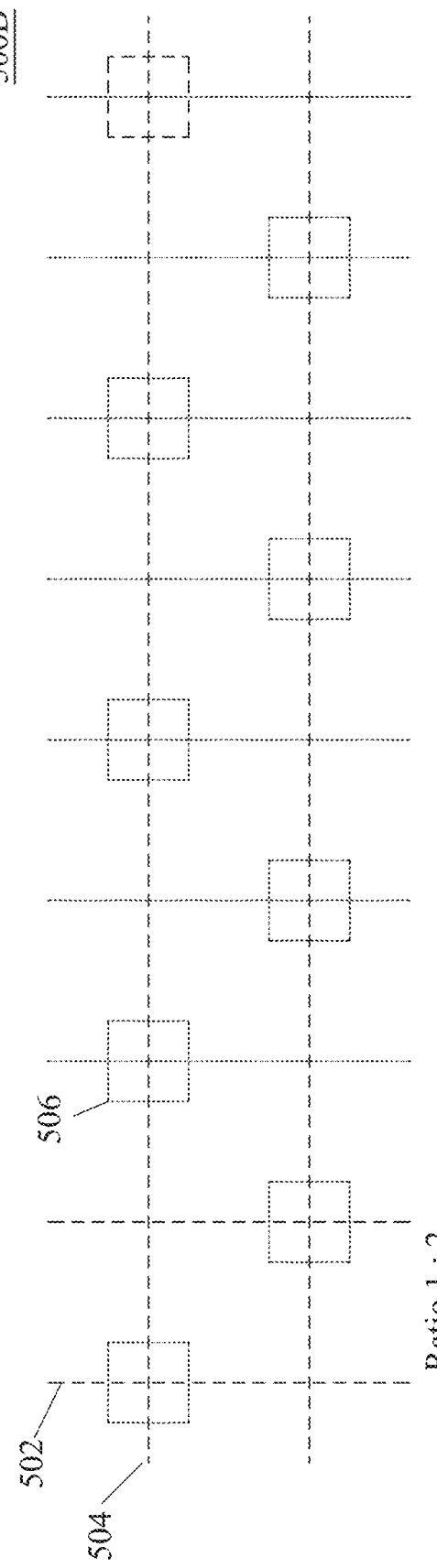

US 11,171,089 B2

LINE SPACE, ROUTING AND PATTERNING METHODOLOGY

PRIORITY CLAIM

This application claims the benefit of U.S. Provisional Application No. 62/753,443, filed on Oct. 31, 2018, the entirety of which is incorporated by reference herein.

BACKGROUND

The semiconductor integrated circuit (IC) industry has continued to experience rapid growth with technological advances in IC materials and designs producing successive generations of ICs, each new generation having smaller geometries and more complex circuits than the previous generation. The complexity of the associated layout, device structures, and manufacturing processes for producing each new generation of ICs has increased correspondingly to achieve the designed functional density.

The performance of advanced patterning and etching processes associated with metal patterning and are affected by density gradient effects (DGE) and/or landing effects (LE) associated with the specific IC device layout configuration being manufactured. Consideration and adjustment of the relative location and spacing of the cut metal pattern is used to mitigate some of the DGE/LE and improve the uniformity and performance of the resulting ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5D are top views of core grids having various ratios between the Pitch$_{MX-1}$ and the Core$_{X_p}$ values in accordance with some embodiments.

DETAILED DESCRIPTION

Figure 1:
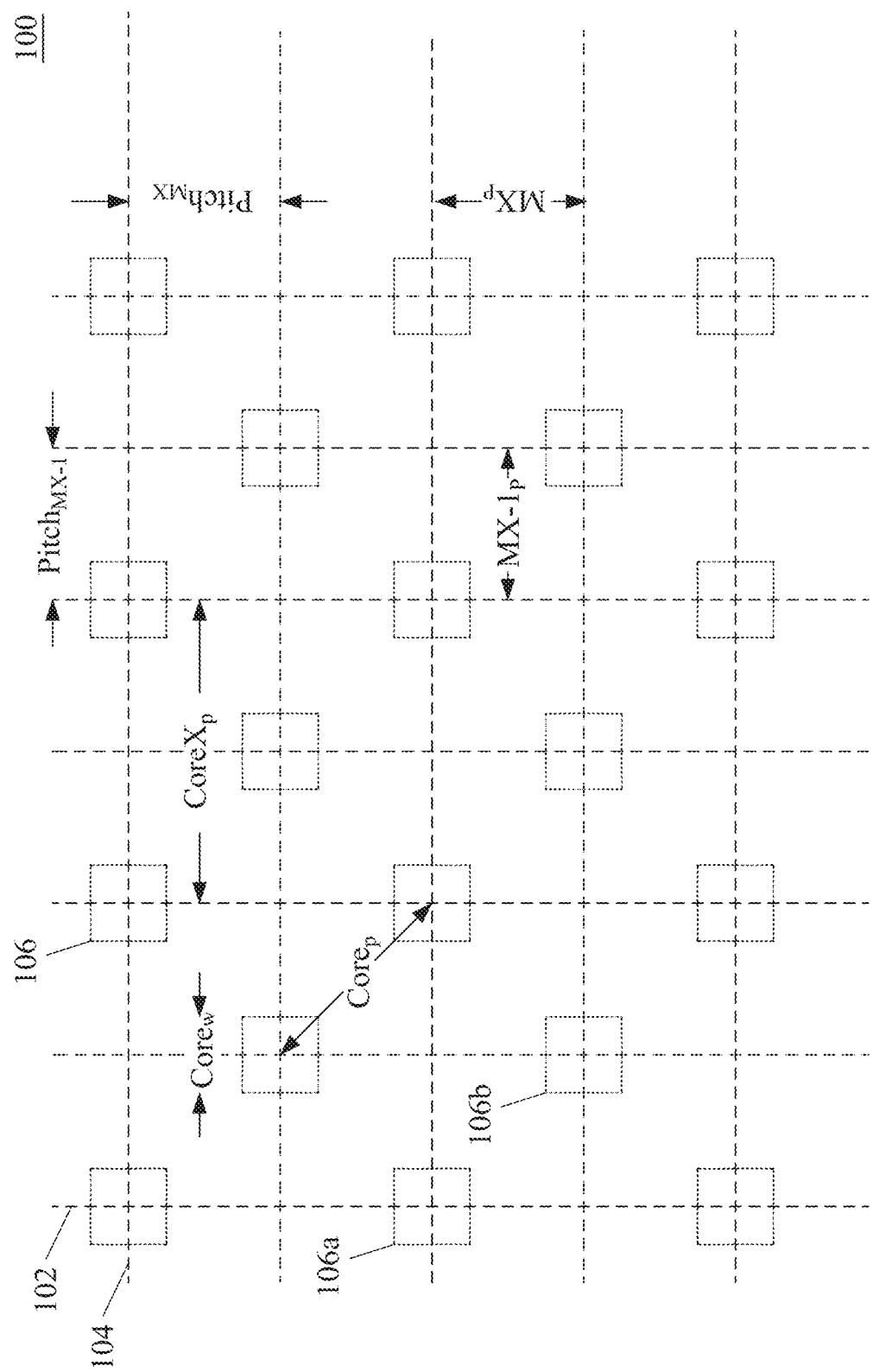
FIG. 1 is a top view of a core grid in accordance with some embodiments.

This description of the exemplary embodiments is intended to be read in connection with the accompanying drawings, which are to be considered part of the entire written description. The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus may be otherwise oriented (rotated 90 degrees or at other orientations) and the spatially relative descriptors used herein may likewise be interpreted accordingly.

A method for simplifying chip-level routing and manufacture of semiconductor IC layout designs generated using an electronic design automation (EDA) tool involves forming a regular metal pattern, e.g., a base level metal interconnect pattern (metal zero (M0)), and then selectively cutting (removing) portions of the metal pattern according to the applicable design rules. Metal cuts on the base level metal interconnect pattern (CM0) at the cell boundaries of a standard cell layout (boundary metal cuts) are used to separate/disconnect adjacent standard cells such that each of the separated cells are able to perform independently designated function(s).

In addition to the boundary metal cuts, in some embodiments additional internal metal cuts are made for further adapting the standard cell for a designated function and/or for reducing parasitic capacitances associated with redundant or unused portions of the base level metal interconnect pattern. Both the boundary metal cuts and the internal metal cuts are aligned with either poly/gate electrodes (CM0B/PO)

or the source/drain conductors (CM0B/MD). Some embodiments of the present disclosure describe metal cut methods for reducing DGE/LE and/or parasitic capacitance without the use of an additional mask layer and without additional modification of the internal configuration of the individual standard cells, which reduces a cost of a manufacturing process and time for developing a new layout for an IC.

Some embodiments of the metal cut methods utilize a modified metal-cut mask layer, i.e., a mask layer that exposes those regions of the base level metal interconnect pattern that are to be removed and protects those regions of the base level metal interconnect pattern that are to be preserved in the final IC device.

In some embodiments, the conductive layers from which the interconnections for power, ground, and signal lines are patterned comprise one or more conductive materials including aluminum, copper, cobalt, tungsten, titanium, nickel, gold, platinum, graphene, silicides, salicides, and mixtures and alloys thereof, applied to a substrate singly, in series, and/or in combination. The conductive layer deposition processes include one or more of chemical vapor deposition (CVD) processes, atomic layer deposition (ALD) processes, plasma vapor deposition (PVD) process, electroplating processes, electroless plating processes, and any other suitable application process(es) or combinations thereof.

In some embodiments, lithographic methods are used for forming features of integrated circuits on wafers. The lithographic methods involve applying a photo resist and defining patterns in the photo resist. The patterns in the photo resist are first defined in a lithography mask and, depending on the selection of the photo resist, are implemented either by the transparent portions or by the opaque portions of the lithography mask. The patterns in the lithography mask are transferred to the photo resist through an exposure using the lithography mask, followed by the development of the photo resist. The patterns in the patterned photo resist are then transferred into the various manufactured structures formed on a wafer.

Various techniques have been created to implement double or multiple patterning. One technique is a pattern-etch-pattern-etch (2P2E) technique. In a 2P2E technique, a pattern is divided into two parts that are implemented sequentially during the IC device manufacturing process using two patterning steps with each patterning step followed by a corresponding etch (removal) process. The removal process is performed to remove portions of the underlying material layer, e.g., a metal layer (M0-MX), interlayer dielectric (ILD), and/or other materials in order to achieve the desired device topography. In some embodiments, a directional (anisotropic) etching (DrE) process is used for selectively expanding initial openings along a predetermined axis. In some embodiments, the 2P2E technique is replaced by a pattern-etch (1P1E) process that, as a consequence of the reduced number of processing steps, will improve utilization of the fab production resources and/or improve the yield of the IC devices being manufactured.

Multiple patterning (or multi-patterning) processes encompass a group of techniques and methods that have been developed to allow for the imaging of ever smaller metal patterns used for increasing feature density in a layout beyond what is achievable during the manufacture of integrated circuits using a single mask. Double patterning is a technology developed for lithography to enhance feature density in integrated circuits, but each additional mask utilized in the production of an IC device increases the cost of manufacturing, reduces the production capacity of the fab, and/or increases the likelihood of introducing one or more defects. In some embodiments, smaller feature sizes have been formed using extreme ultraviolet (EUV) exposure wavelengths for lithography processes and the corresponding use of EUV patterns and masks. By reducing the number of patterning operations in the production flow for manufacturing an IC device, the techniques and methods disclosed herein improves contact access, simplifies the design process, simplifies the manufacturing process, improves manufacturing yield, and/or reduces manufacturing costs.

Some embodiments utilize a core grid-based routing pattern that is characterized by relevant parameters including, e.g., core width ($Core_w$), $core_X$ pitch ($CoreX_p$), core pitch ($Core_p$), and $M_{X-1}$ pitch ($MX-1_P$ or $Pitch_{MX-1}$), MX pitch ($MX_P$ or $Pitch_{MX}$), and VIA pitch ($VIA_P$). As used herein, core pitch ($Core_p$) refers to the spacing between horizontally offset core locations arranged on adjacent horizontal axes while $core_X$ pitch ($CoreX_p$) refers to the spacing between adjacent core locations arranged along a single horizontal axis. In some embodiments, certain of the predetermined core locations are opened to provide opened cores that permit an electrical connection to an underlying conductive pattern, e.g., metal pattern layer MX-1, over which a subsequent metal pattern layer MX is formed. The openings in this core grid are then subsequently modified by directional etching (DrE) in order to extend the opened cores along a series of parallel MX axes to define the desired pattern. The DrE process will include a set of parameters including, e.g., the length of the directional etch opening formed on either side of the core opening ($DrE_L$), metal end-to-end (EtE or E2E) spacing, overlap distance (or stitch length), and minimum metal length. These parameters will, in turn, be adapted for generating a core grid pattern that, in combination with the subsequent DrE processing, will generate the desired feature density defined by the applicable design rules while providing for increased flexibility for addressing landing effects and density gradient effects.

FIG. 1 is a top view of a core grid 100 in accordance with some embodiments that includes a number of vertical axes 102 corresponding to the pitch of an underlying metal layer MX-1, a number of horizontal axes 104 corresponding to the pitch of an overlying metal layer MX, i.e., the axes 104 are separated by $Pitch_{MX-1}$, with the core locations 106 having a characteristic width of $Core_w$ at which openings are formed for use in establishing electrical connections between respective portions of the MX-1 and MX metal layers. The underlying metal layer MX-1 is closer to the substrate than the core grid 100. The overlying metal layer MX is farther from the substrate than the core grid 100. In some embodiments, the placement of the core locations 106a, 106b on adjacent horizontal axes 104 are offset by one half the core-to-core pitch (i.e., 0.5×$CoreX_p$) to establish an even spacing between offset core locations 106 aligned on adjacent horizontal axes 104 of $Core_p$. The absolute value of $Core_p$ are determined based on the particular design rules being utilized designing the underlying metal layer MX-1 of an IC device for manufacture using a predetermined manufacturing process. In some embodiments, the core locations 106 will be separated by a distance at least equal to or greater than the via pitch (the minimum spacing allowed between adjacent vias) specified in the applicable design rules for the particular metal layer according to the relationships:

$$Core_P \geq VIA_P$$

where $Core_P$=core pitch and $VIA_P$=VIA pitch, and $$CoreX_P = 2*\sqrt{Core_p^2 - MxP^2}$$

where $Core_{X_p}$=$core_X$ pitch; $Core_P$=core pitch; and MxP=MX pitch.

In some embodiments, the core locations 106 will be separated by a distance generally corresponding to the resolution of the particular photolithographic process being utilized which, for EUV processes can be around 36-45 nm using a single pattern/single etch (1P1E) (EUV wavelength is ≈13.5 nm). If the metal patterning process utilizes a double EUV process, the resolution can be reduced to distances on the order of 15-23 nm. However, process yields and reliability tend to be improved by providing good pin access between the MX-1 and MX routings so less aggressive imaging processing is utilized. In some embodiments, the design rules and processing correspond more closely to the node N7 and/or N10 processes which, in some embodiments, are exposed using a 193 nm (the approximate wavelength of the light source) immersion process to achieve spacings on the order of 72-90 nm. In some embodiments, this distance is reduced by using an immersion double patterning process.

Figure 2:
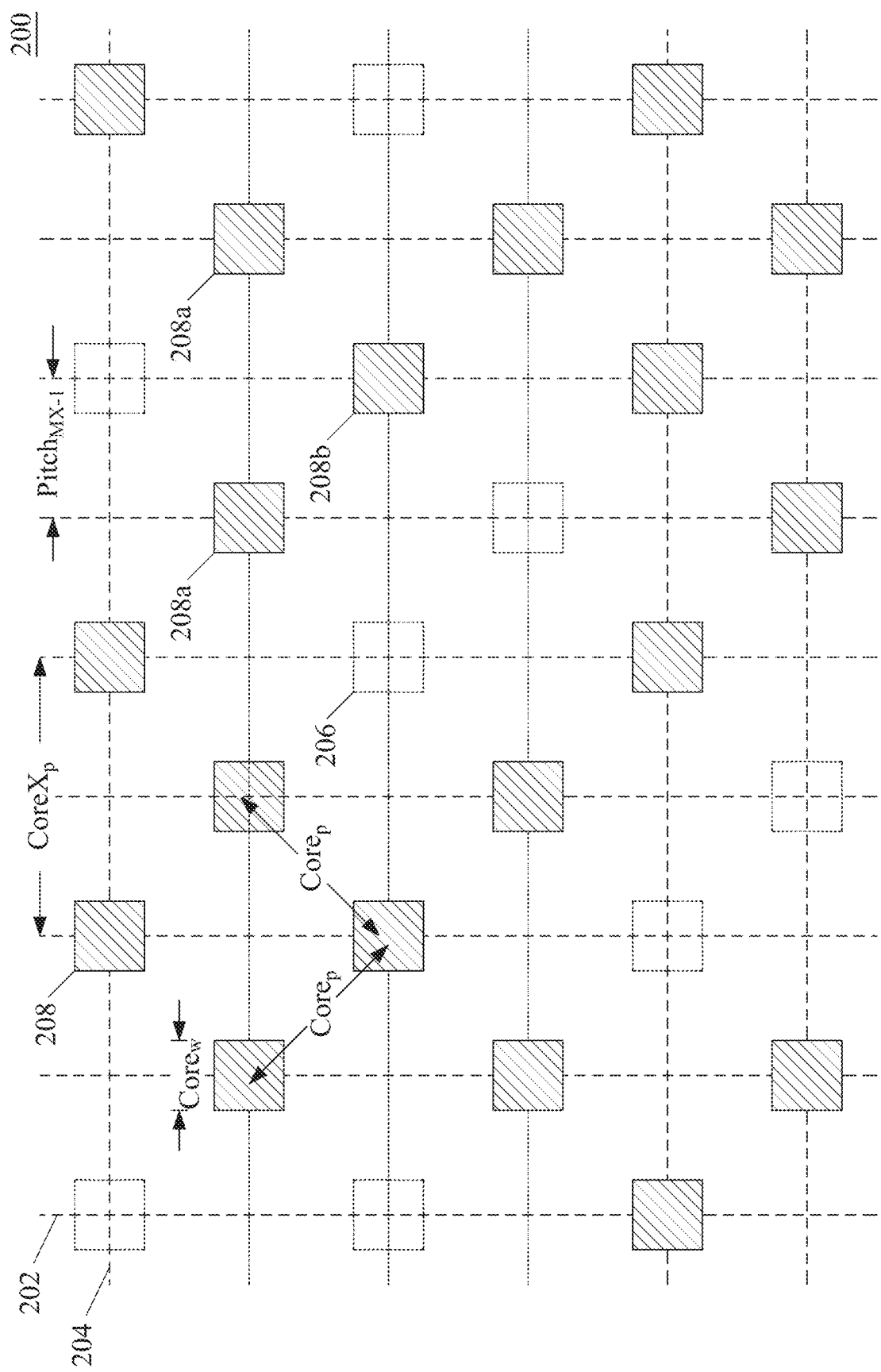
FIG. 2 is a top view of a core grid including a plurality of cores in accordance with some embodiments.

FIG. 2 is a top view of a core grid 200 including a plurality of opened cores 208 that have been opened in a portion of the available core locations 206 in accordance with some embodiments. Opening the selected cores involves coating the substrate with a photoresist composition, exposing the photoresist layer with a core pattern, developing the exposed photoresist to open expose the substrate surface in the core locations, and then etching the exposed substrate material to form an opened core that exposes a portion of the underlying MX-1 pattern. Each of unopened core locations 206 and the opened cores 208 is aligned with both a vertical axis 202, corresponding to the pitch of an underlying metal layer MX-1, and a horizontal axis 204 corresponding to the pitch of the next metal layer MX, i.e., the axes 204 are separated by $Pitch_{MX-1}$, and a number of opened cores 208, having a characteristic width of $Core_w$, are formed for use in establishing electrical connections between respective portions of the MX-1 and MX metal layers. In some embodiments, the placement of the opened cores 208a, 208b on adjacent horizontal axes 204 are offset by one half the core-to-core pitch (i.e., 0.5× $CoreX_p$) to establish a spacing of $Core_p$ between offset opened cores 208a, 208b aligned on adjacent horizontal axes 204.

Figure 3:
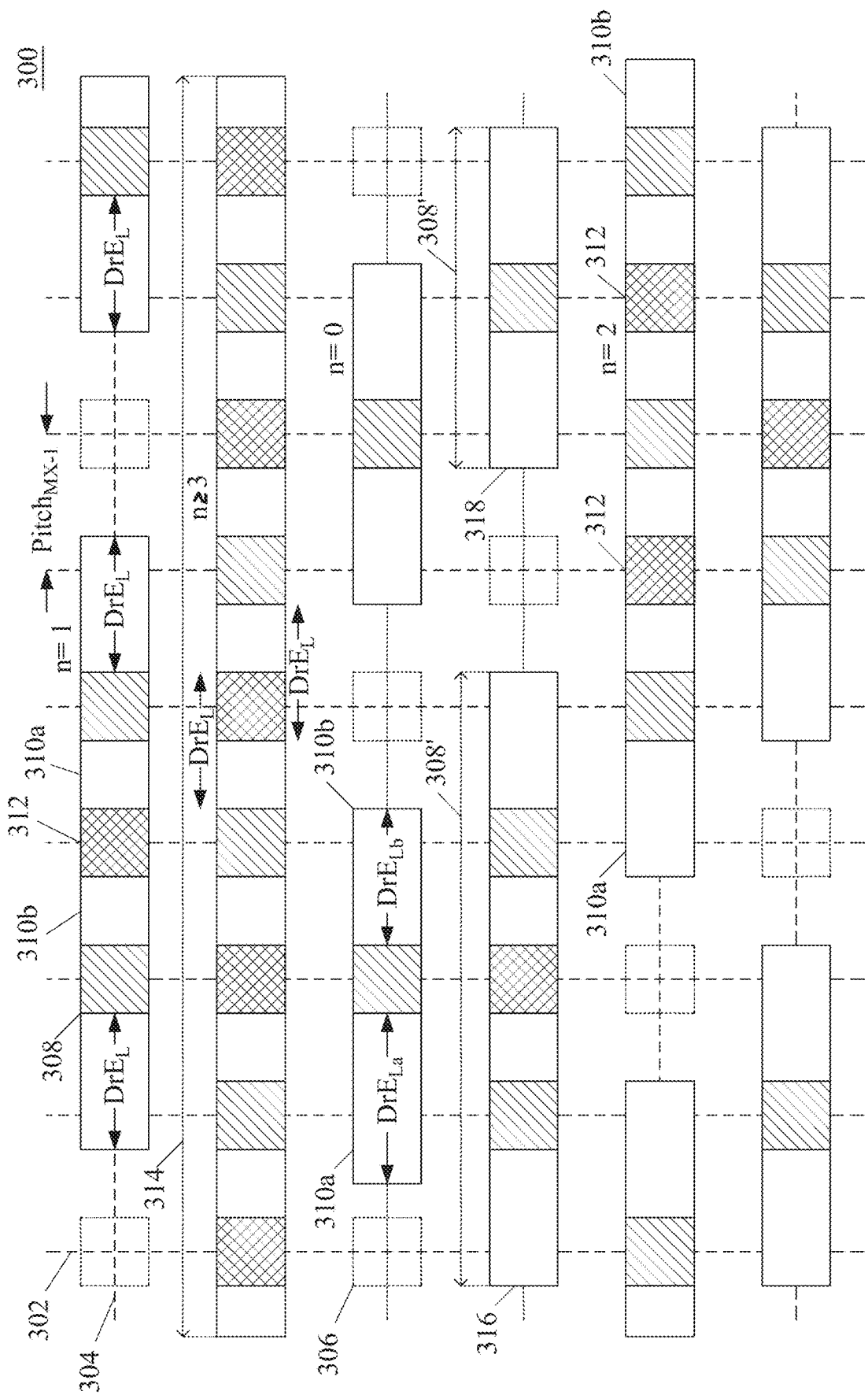
FIG. 3 is a top view of a core grid in which cores have been extended through a directed (or directional) etch and filed with a conductive material, e.g., metal, in accordance with some embodiments.

FIG. 3 is a top view of a core grid 300 in which opened cores 308 have been extended through use of a directional (or directed) etch to form expanded core openings 308' and then filed with a conductive material, e.g., metal, in accordance with some embodiments. Each of available core locations 306 and the opened cores 308 is aligned with both a vertical axis 302, corresponding to the pitch of an underlying metal layer MX-1, and a horizontal axis 304 corresponding to the pitch of the next metal layer MX, i.e., the axes 304 are separated by $Pitch_{MX-1}$, and a number of opened cores 308, having a characteristic width of $Core_w$ at which openings are formed for use in establishing electrical connections between respective portions of the MX-1 and MX metal layers. In some embodiments, the directional etch DrE extends the opened cores 308 along the horizontal axes 304 to form a pair of etch extension regions 310a, 310b on both sides of the opened core in order to extend the length of the opened core 308 by $2*DrE_L$ to form an expanded core opening 308'. In some embodiments, the DrE can be applied in a manner whereby the etch extension regions 310a, 310b are not equal in length, in which case the length of the opened core 308 is extended by $DrE_{La}+DrE_{Lb}$ to form the expanded core opening 308'.

In some embodiments, elongated conductors 314 are produced by using directional etch DrE to extend each of a series of closely spaced opened cores 308 along one horizontal axis 304. In order to produce such an elongated conductor 314, the combination of the etch extension regions 310a, 310b, each having a length $DrE_L$, will be greater in the separation between opened cores 308, thereby providing for a stitch overlap region 312 (a region that is subjected to DrE from both directions as a result of the location between adjacent opened cores 308) to help ensure that the underlying material has been removed to avoid narrowing of a conductive material filling the expanded core opening 308' that could lead to electromigration (EM) issues. Conversely, in some embodiments, a plurality of conductors 316, 318 are formed in expanded core openings 308' that are separated by a distance sufficient to prevent electrical contact between adjacent conductors. In some embodiments, each of the conductors is characterized by an n value, where n is an integer corresponding to the number one less than the number of opened cores utilized in forming a particular conductor. The stitch overlap region 312 satisfies the relationship:

$$Core_W + 2*DrE_L - CoreX_p \geq Stitch\ Overlap$$

where $Core_W$=core width; $CoreX_p$=$core_X$ pitch; $DrE_L$=directional etch length; and Stitch Overlap is a length by which $2*DrE_L$ exceeds the spacing between adjacent opened cores.

Figure 4:
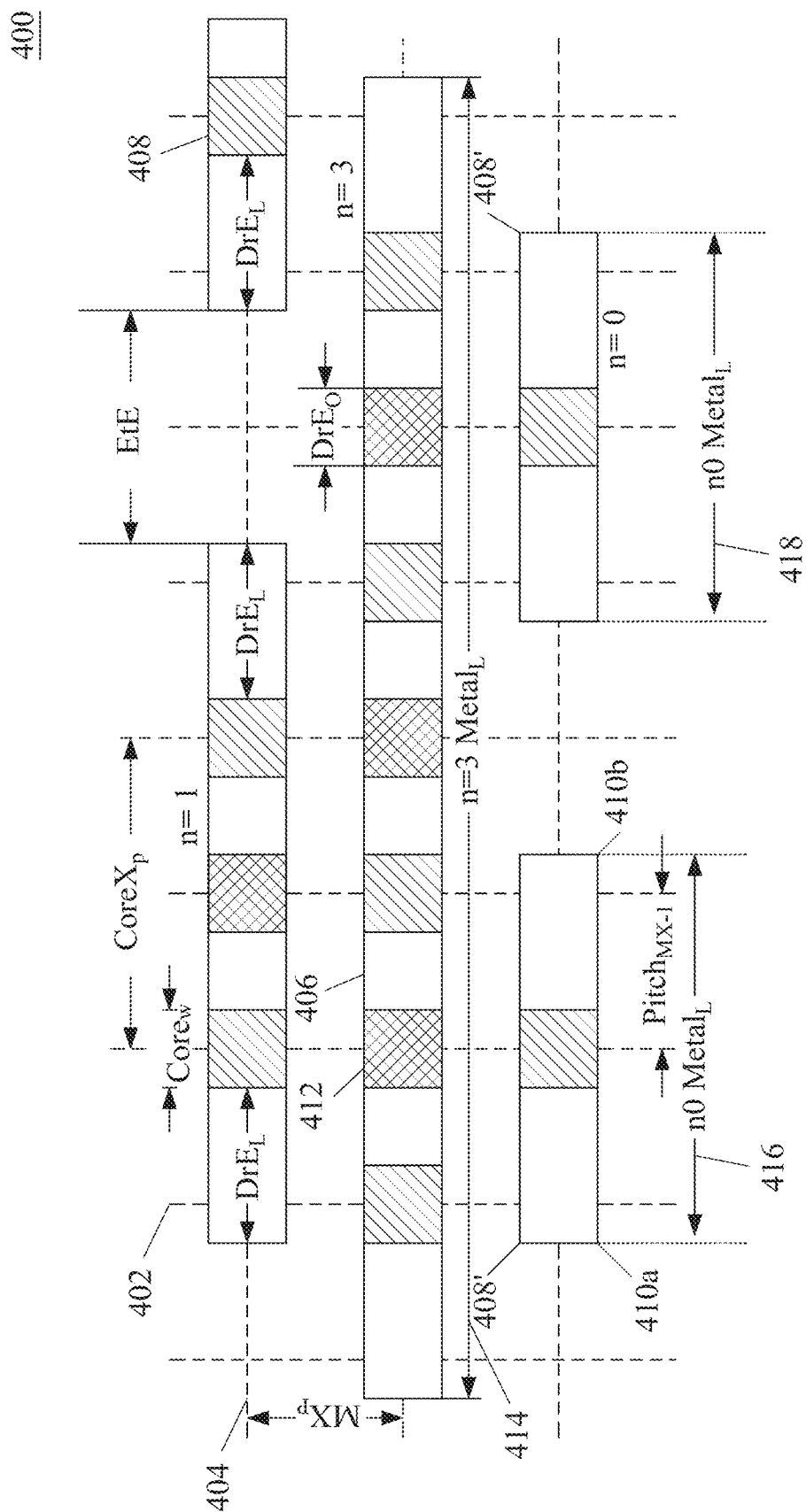
FIG. 4 is a top view of a core grid in which cores have been extended through a directed etch and filed with a conductive material, e.g., metal, in accordance with some embodiments.

FIG. 4 is a top view of a core grid 400 in which opened cores 408 have been extended through use of a directional etch and then filed with a conductive material, e.g., metal, in accordance with some embodiments. In some embodiments, each of available core locations and the opened cores 408 is aligned with both a vertical axis 402, corresponding to the pitch of an underlying metal layer MX-1, and a horizontal axis 404 corresponding to the pitch of the next metal layer MX, i.e., the axes 404 are separated by $Pitch_{MX-1}$, and a number of core locations 406 having a characteristic width of $Core_w$, at which openings are formed for use in establishing electrical connections between respective portions of the MX-1 and MX metal layers. In some embodiments, the directional etch DrE extends the opened cores 408 along the horizontal axes 404 and forming etch extension regions 410a, 410b having a length $DrE_L$ on both sides of the opened core 408 in order to extend the length of the opened core 408 by up to $2 \times DrE_L$ to form an expanded core opening 408'. In some embodiments, the opened core is separated from adjacent opened cores by a distance sufficient to prevent the respective expanded core openings 408' from overlapping. In such instances, the isolated expanded core opening 408', when filled with metal, forms a conductor having a minimum metal length. The minimum metal length may be determined according to the formula:

$$Min.Metal_L = Core_W + 2*DrE_L$$

where $Core_W$=core width; $DrE_L$=directional etch length, and $Min.Metal_L$ is the minimum length of the conductor formed using a single expanded core opening (i.e., n=0).

In some embodiments (not shown), only some of the available core locations 406 are aligned with a vertical axis 402 corresponding to the pitch of an underlying metal layer MX-1, thereby reducing the number of available core locations 406 that are available for establishing electrical contact between the MX-1 and MX metal layers. In some embodiments, the DrE can be applied in a manner whereby the etch extension regions 410a, 410b are not equal in length, in which case the length of the opened cores 408 is extended by $DrE_{La}+DrE_{Lb}$ to form the expanded core opening 408'.

In some embodiments, elongated conductors 414 are produced by forming a series of closely spaced expanded core openings 408' along one horizontal axis 404. In order to produce such an elongated conductor 414, the combination of the etch lengths 410a, 410a will be greater than the separation between adjacent opened cores 408, thereby providing for stitch overlap regions 412 having a length $DrE_O$ to ensure that the underlying material has been removed to avoid narrowing of the conductive material deposited in the expanded core openings 408' that could lead to electromigration (EM) issues. Conversely, in some embodiments, a plurality of conductors 416, 418 are formed in expanded core openings 408' that are separated by a distance sufficient to prevent the formation of direct electrical contact between two adjacent conductors and maintain at least a minimum end-to-end spacing (EtE or E2E) between the adjacent conductors along a horizontal axis 404 according to the relationship:

$$EtE = 2*CoreX_P - Core_W - 2*DrE_L$$

where $Core_W$=core width; $DrE_L$=directional etch length; $CoreX_p$=core$_X$ pitch; and EtE is the minimum spacing between the opposing ends of two adjacent expanded core openings.

In some embodiments, each of the conductors is characterized by an n value, where n is an integer corresponding to the number one less than the number of opened cores utilized in forming a particular conductor. Conductors characterized by the same n value will have substantially similar metal lengths $Metal_L$ according to the relationship:

$$Metal_L = (Core_W + 2*DrE_L)CoreX_P*n$$

where $Core_W$=core width; $DrE_L$=directional etch length; $CoreX_p$=core$_X$ pitch; n an integer corresponding to the number of opened cores within the expanded core opening and $Metal_L$ is the overall length of the resulting expanded core opening.

FIGS. 5A-5D are top views of core grids 500A-D in accordance with some embodiments that includes a number of vertical axes 502 corresponding to the pitch of an underlying metal layer MX-1, a number of horizontal axes 504 corresponding to the pitch of the next metal layer MX, i.e., the axes 504 are separated by $Pitch_{MX-1}$, with core locations 506 having a characteristic width of $Core_w$ at which openings are formed for use in establishing electrical connections between respective portions of the MX-1 and MX metal layers. According to some embodiments, core grids 500A-D are configured to provide various ratios between the $Pitch_{MX-1}$ and the $Core_{X_p}$ values.

In some embodiments, the $Pitch_{MX-1}$:$Core_{X_p}$ ratios along each horizontal axis 504 will range from 1:1 to 1:6, but, in general, lower integer value ratios will provide the most frequent alignment with the underlying portions of metal layer MX-1 arranged along vertical axes 502 and, consequently, will provide the most opportunities and/or flexibility for establishing desired connections between successive metal layers. In some embodiments, the $Pitch_{MX-1}$:$Core_{X_p}$ ratios along adjacent horizontal axes 504 will be identical, while in some embodiments, at least one of the horizontal axes will have a $Pitch_{MX-1}$:$Core_{X_p}$ ratio that is different than the $Pitch_{MX-1}$:$Core_{X_p}$ ratio(s) utilized on other axes.

FIGS. 6A-6H are top views of core grids 600A-H in which a set of opened cores 608 have been opened and extended through use of a directional etch (DrE) and then filed with a conductive material, e.g., metal, in accordance with some embodiments. In some embodiments, each of available core locations 606 and the opened cores 608 is aligned with both a vertical axis 602, corresponding to the pitch of an underlying metal layer MX-1, and a horizontal axis 604. In some embodiments, the horizontal axes 604 correspond to the pitch of the next metal layer MX, i.e., adjacent axes 604 are separated by a distance $Pitch_{MX}$. In some embodiments, the initial core openings 608 are formed (and then expanded using DrE) for use in establishing electrical connections between respective portions of the MX-1 and MX metal layers.

Figures 6A, 6B:
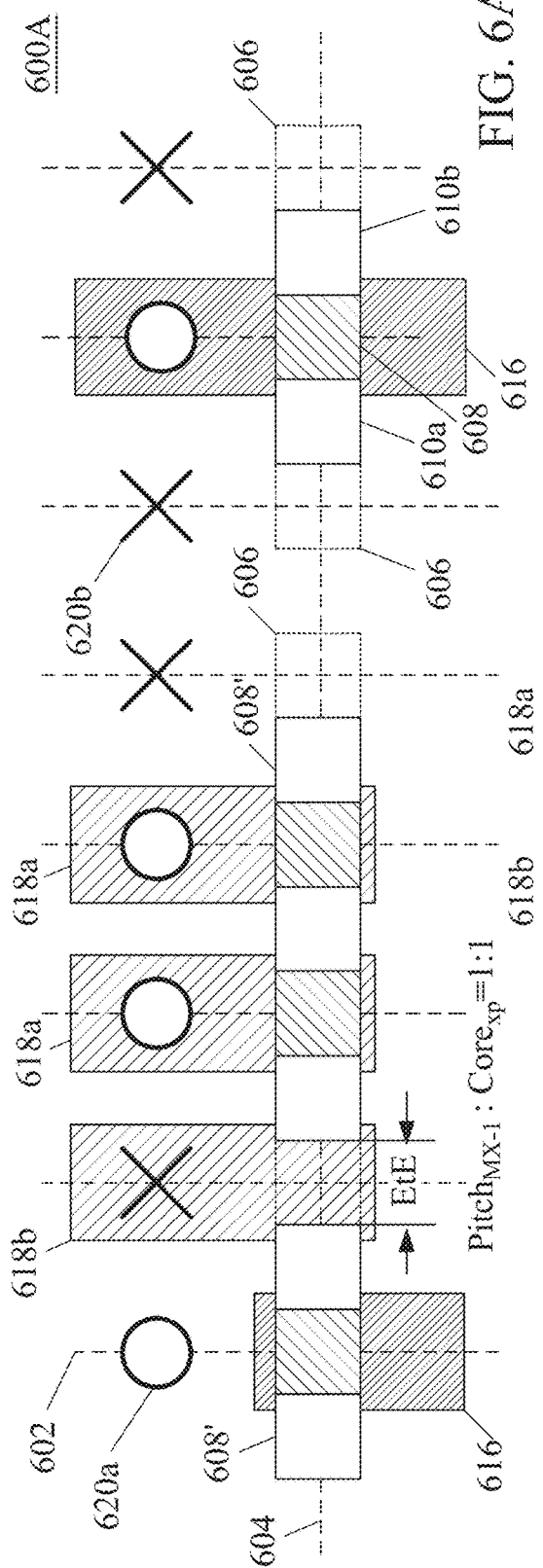
FIGS. 6A-6H are top views of core grids having various ratios between the Pitch$_{MX-1}$ and the Core$_{X_p}$ values in which cores have been extended through a directed etch and filed with a conductive material, e.g., metal, in accordance with some embodiments.

FIG. 6A is a top view of a core grid 600A in accordance with some embodiments in which the core locations 606 are configured with a $Pitch_{MX-1}$:$Core_{X_p}$ ratio of 1:1. Opened cores 608 are then formed at certain of the core locations 606 and then expanded using a direction etching process in order to expand the opened cores 608 by a predetermined directional etch length $DrE_L$ of the etch extension regions 610a, 610b from the opened core(s) 608 to produce expanded core openings 608'. When filled with metal, the expanded core openings 608' will each produce a conductor in contact with a portion of the underlying metal layer MX-1 having a characteristic metal length $Metal_L$. In some embodiments, adjacent expanded core openings 608' are separated by at least a minimum end-to-end (EtE) spacing sufficient to suppress the formation of direct electrical contact between the conductors formed in the expanded core openings 608'.

In some embodiments, the EtE spacing is a design parameter associated with a particular metal layer that is used by designers and/or routing applications. In some embodiments, the EtE spacing is different for different metal layers used in establishing electrical connections within an IC device. For example, the EtE spacing typically increases as a distance from a substrate increases, i.e., in upper metal layers, in some embodiments. In some embodiments, the opened cores 608 are formed over an underlying metal pattern MX-1 that includes first portions 616 forming a first signal path and second portions 618a, 618b, forming a second signal path that is electrically isolated from the first signal path. The placement of the core openings, and the predetermined directional etch length $DrE_L$ of the etch extension regions 610a, 610b determines the availability of connections to the underlying portions of the metal layer MX-1 aligned with the vertical axes 602.

In some embodiments, evaluating the availability of an electrical connection between the sequential metal layers MX-1 and MX involves electronically overlaying the MX-1 metal layout with the MX metal layout and determining which of the expanded core openings 608' along a horizontal axis 604 allows for a connection between MX and MX-1. In some embodiments, the $Pitch_{MX-1}$:$Core_{X_p}$ ratio is not an integer and results in various degrees of offset between the MX and MX-1 metal layers. In some embodiments, certain degrees of offset between the MX and MX-1 metal layers result in a core location/MX-1 overlap that, although not completely aligned, is sufficiently aligned to satisfy the relevant design rules, thereby making the offset core location available for establishing an electrical connection between the MX and MX-1 metal layers. Using the relevant MX-1 and MX design and placement information, each of the intersections with vertical axes 602 along a horizontal axis 604 is evaluated and then designated as either available "◯" 620a, or unavailable "X" 620b, for connection to the underlying MX-1 metal layer components comprising a first signal line 616 and second signal lines 618a (connectable to metal layer MX through a opened core) and 618b (not connectable to MX).

FIG. 6B is a top view of a core grid 600B in accordance with some embodiments in which the core locations 606 are configured with a Pitch$_{MX-1}$:Core$_{X_p}$ ratio of 1:1.5. Opened cores 608 are then formed at certain of the core locations 606 and then expanded using a direction etching process. When filled with metal during formation of the metal layer MX, the final core openings 611, 611' each produce a metal conductor in contact with a portion of the underlying metal layer MX-1 having a characteristic metal length Metal$_L$. Using the relevant design and placement information, each of the vertical axes 602 of core grid 600B is evaluated and designated as either available "○" 620a, or unavailable "X" 620b, for connection to the underlying MX-1 metal layer components comprising a first signal line 616 and second signal lines 618a (connectable to metal layer MX through a opened core) and 618b (not connectable to MX).

Figure 6C:
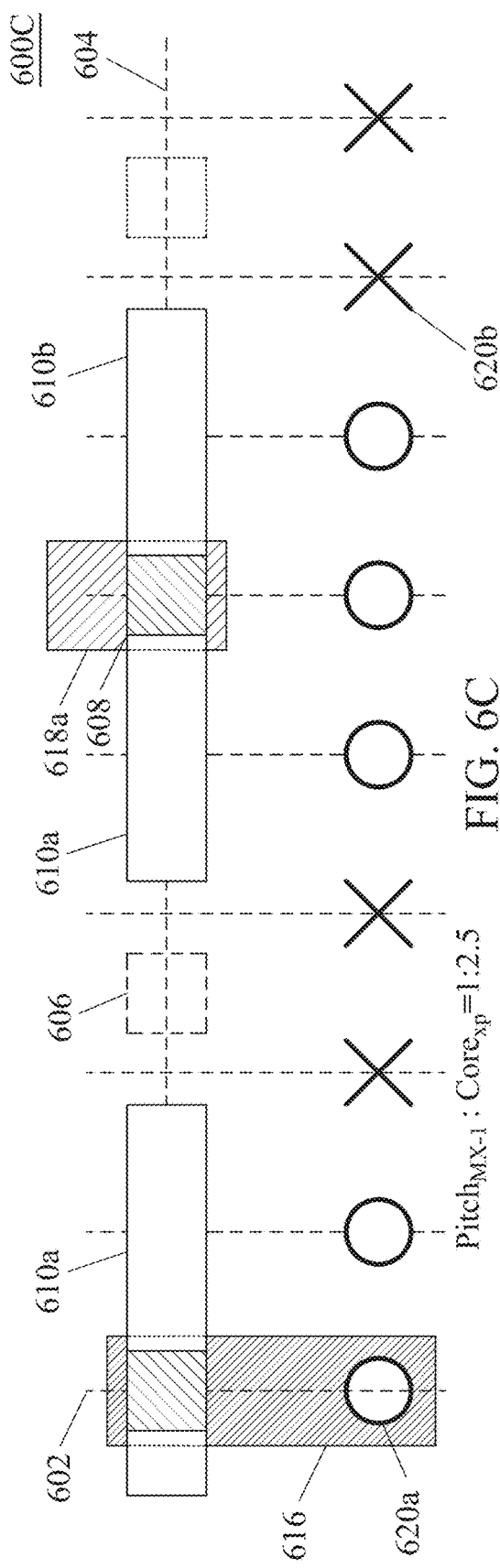

FIG. 6C is a top view of a core grid 600C in accordance with some embodiments in which the core locations 606 are configured with a Pitch$_{MX-1}$: Core$_{X_p}$ ratio of 1:2.5. Opened cores 608 are then formed at certain of the core locations 606 and then expanded using a direction etching process. When filled with metal during formation of the metal layer MX, the final core openings each produce a metal conductor in contact with a portion of the underlying metal layer MX-1 having a characteristic metal length Metal$_L$. Using the relevant design and placement information, each of the vertical axes 602 of core grid 600C is evaluated and designated as either available "○" 620a, or unavailable "X" 620b, for connection to the underlying MX-1 metal layer components comprising a first signal line 616 and second signal lines 618a (connectable to metal layer MX through a opened core) and 618b (not connectable to MX).

Figure 6D:
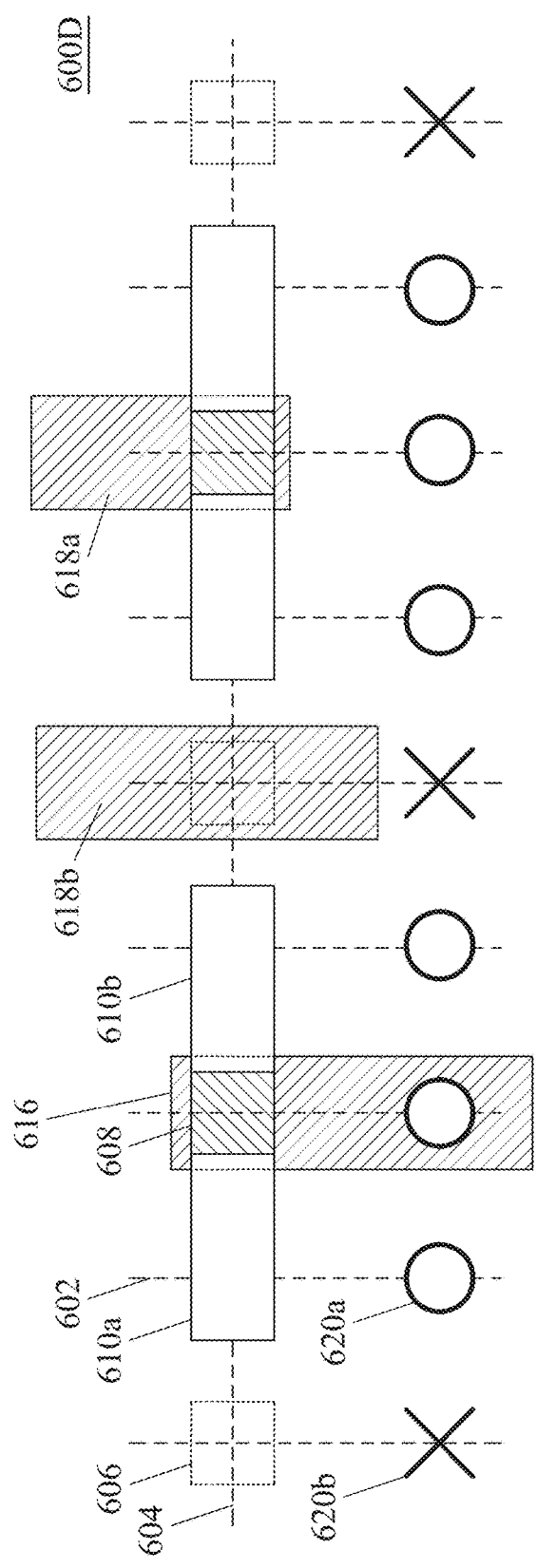

FIG. 6D is a top view of a core grid 600D in accordance with some embodiments in which the core locations 606 are configured with a Pitch$_{MX-1}$: Core$_{X_p}$ ratio of 1:2. Opened cores 608 are then formed at certain of the core locations 606 and then expanded using a direction etching process. When filled with metal during formation of the metal layer MX, the final core openings each produce a metal conductor in contact with a portion of the underlying metal layer MX-1 having a characteristic metal length Metal$_L$. Using the relevant design and placement information, each of the vertical axes 602 of core grid 600D is evaluated and designated as either available "○" 620a, or unavailable "X" 620b, for connection to the underlying MX-1 metal layer components comprising a first signal line 616 and second signal lines 618a (connectable to metal layer MX through a opened core) and 618b (not connectable to MX).

Figure 6E:
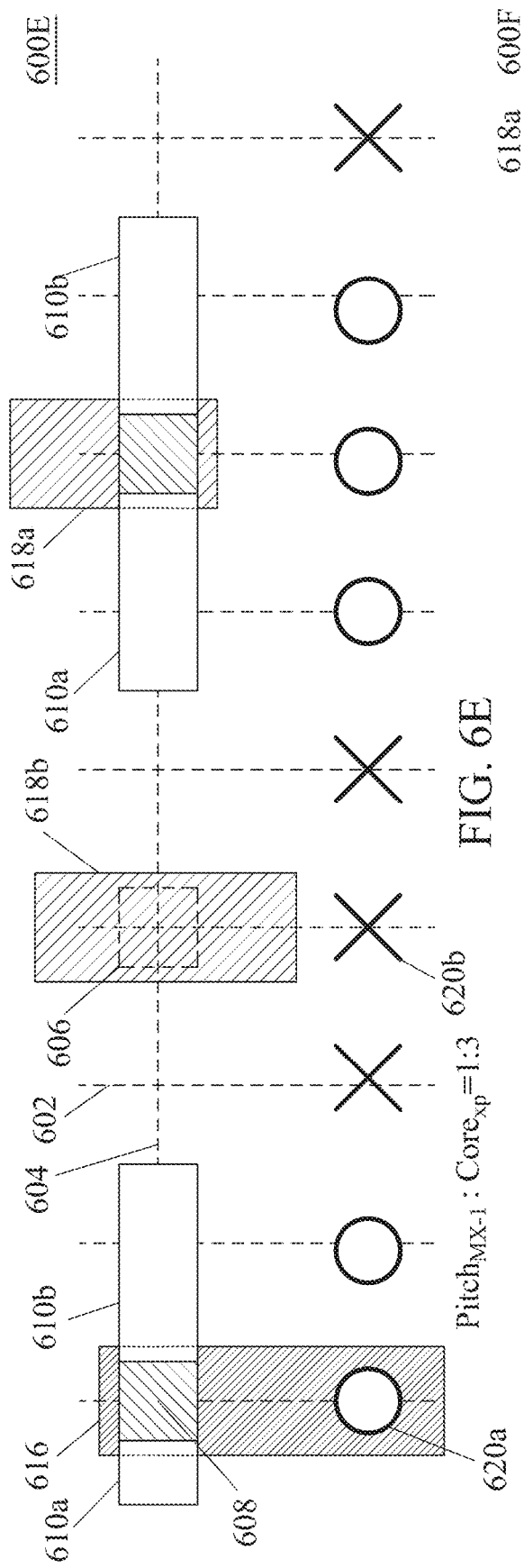

FIG. 6E is a top view of a core grid 600E in accordance with some embodiments in which the core locations 606 are configured with a Pitch$_{MX-1}$:Core$_{X_p}$ ratio of 1:3. Opened cores 608 are then formed at certain of the core locations 606 and then expanded using a direction etching process. When filled with metal during formation of the metal layer MX, the final core openings each produce a metal conductor in contact with a portion of the underlying metal layer MX-1 having a characteristic metal length Metal$_L$. Using the relevant design and placement information, each of the vertical axes 602 of core grid 600E is evaluated and designated as either available "○" 620a, or unavailable "X", for connection to the underlying MX-1 metal layer components comprising a first signal line 616 and second signal lines 618a (connectable to metal layer MX through a opened core) and 618b (not connectable to MX).

Figure 6F:
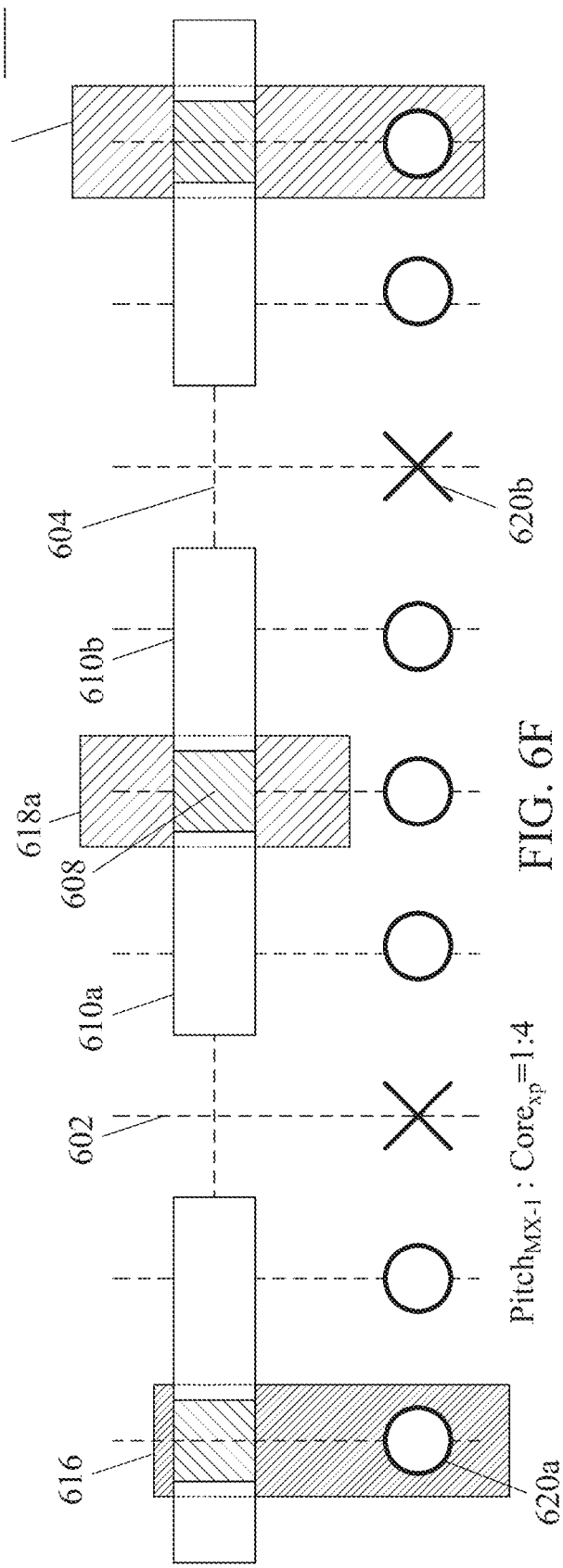

FIG. 6F is a top view of a core grid 600F in accordance with some embodiments in which the core locations 606 are configured with a Pitch$_{MX-1}$:Core$_{X_p}$ ratio of 1:4. Opened cores 608 are then formed at certain of the core locations 606 and then expanded using a direction etching process. When filled with metal during formation of the metal layer MX, the final core openings each produce a metal conductor in contact with a portion of the underlying metal layer MX-1 having a characteristic metal length Metal$_L$. Using the relevant design and placement information, each of the vertical axes 602 of core grid 600F is evaluated and designated as either available "○" 620a, or unavailable "X", for connection to the underlying MX-1 metal layer components comprising a first signal line 616 and second signal lines 618a (connectable to metal layer MX through a opened core).

Figure 6G:
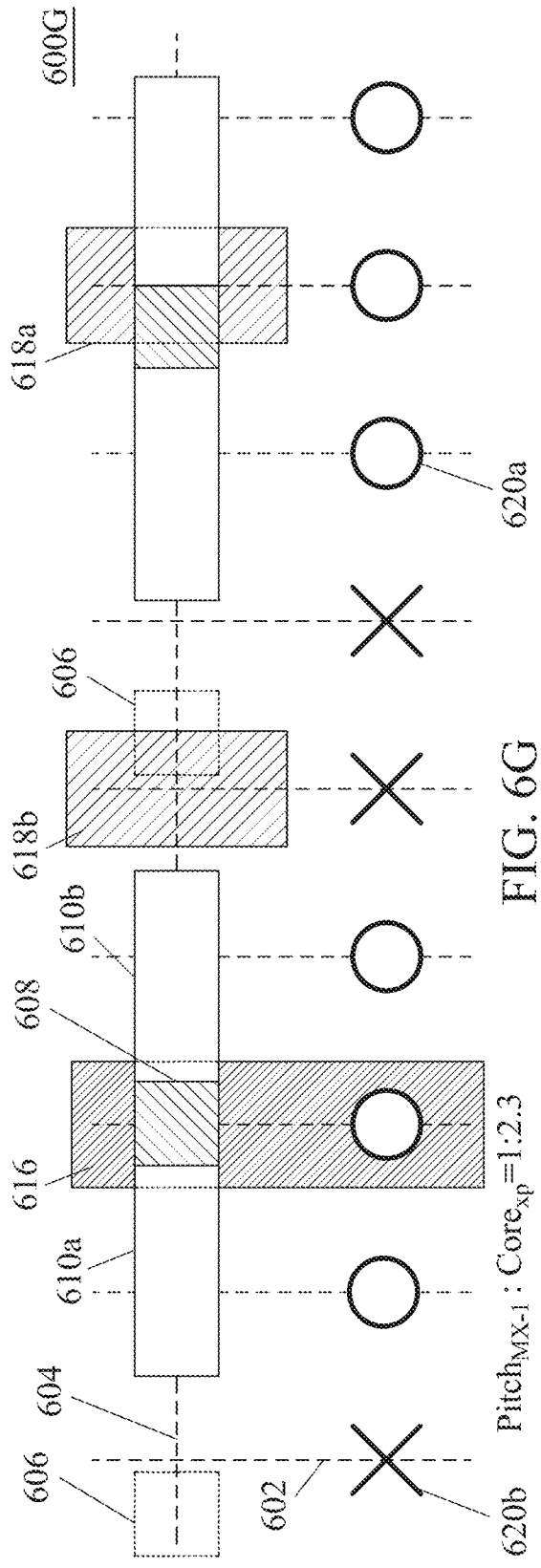

FIG. 6G is a top view of a core grid 600G in accordance with some embodiments in which the core locations 606 are configured with a Pitch$_{MX-1}$:Core$_{X_p}$ ratio of 1:2.3. Opened cores 608 are then formed at certain of the core locations 606 and then expanded using a direction etching process. When filled with metal during formation of the metal layer MX, the final core openings each produce a metal conductor in contact with a portion of the underlying metal layer MX-1 having a characteristic metal length Metal$_L$. Using the relevant design and placement information, each of the vertical axes 602 of core grid 600G is evaluated and designated as either available "○" 620a, or unavailable "X", for connection to the underlying MX-1 metal layer signal lines 616, 618a, 618b. Embodiments in which the Pitch$_{MX-1}$:Core$_{X_p}$ ratio is not an integer, or an integer±0.5, produces some offset overlaps that, depending on the design rules for the particular metal layer being patterned, limits the number of potential contacts between the MX-1 and MX metal layers.

Figure 6H:
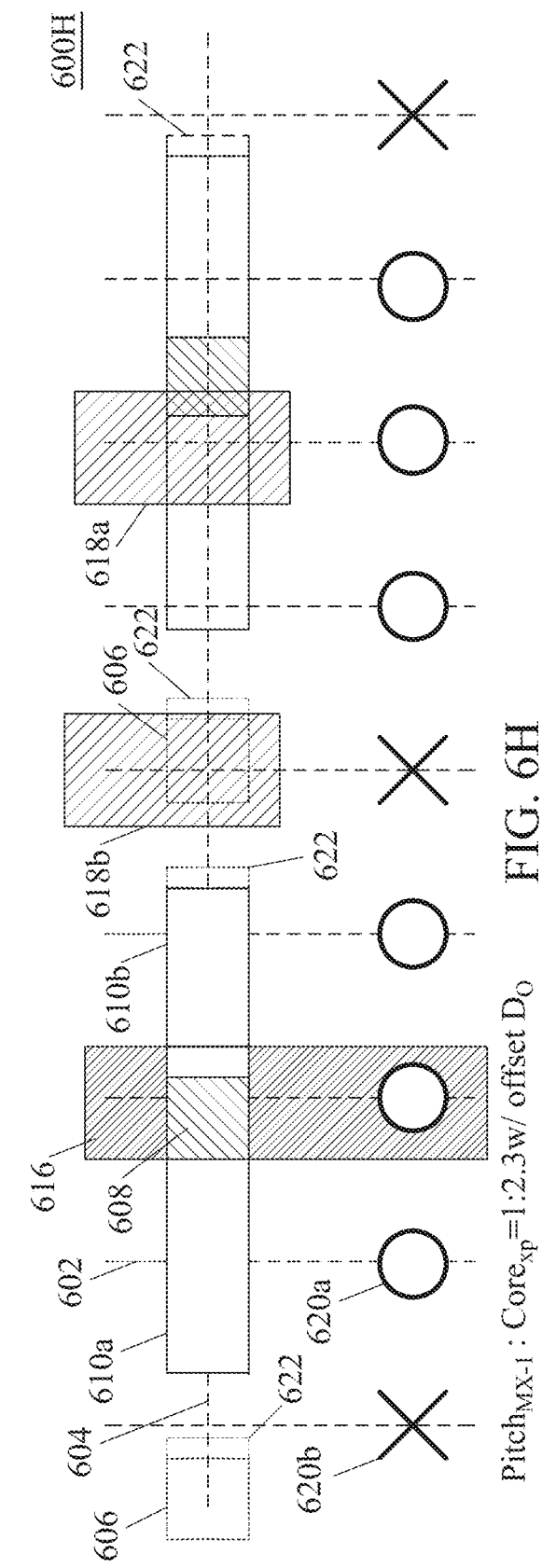

FIG. 6H is a top view of a core grid 600H in accordance with some embodiments in which the core locations 606 are configured with a Pitch$_{MX-1}$:Core$_{X_p}$ ratio of 1:2.3 and in which the core grid has been shifted relative to the alignment of FIG. 6G. In some embodiments, a minor shift 622 of the core grid relative to the MX-1 pattern will shift the designation of the vertical axes 602 of core grid 600H as either available "○" 620a, or unavailable "X", for connection to the underlying MX-1 metal layer signal lines 616, 618a, 618b, particularly relative to the alignment of FIG. 6G.

Figure 7:
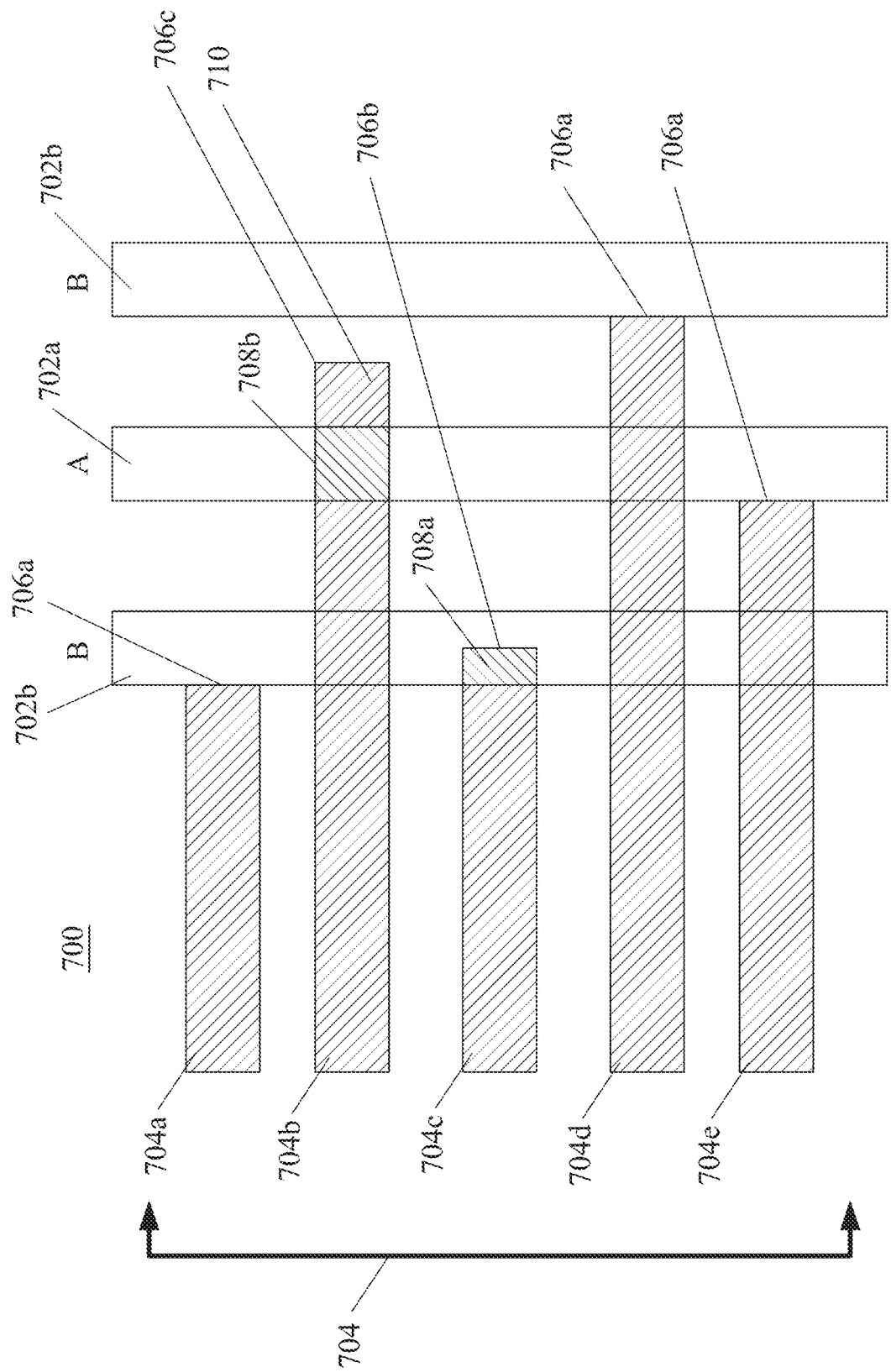
FIG. 7 is a top view of a metal layer showing metal cut locations in accordance with some embodiments.

FIG. 7 is a top view of a metal layer 700 showing a relationship between metal cut locations and portions of a metal layer in accordance with some embodiments in which three metal cut locations, a primary metal cut location (A) 702a bordered by a pair of secondary metal cut locations (B) 702b are available for use in electrically separating various segments of the metal layer 704a-e (collectively 704) formed on an IC device. Advanced process nodes are replacing traditional metal lithographic patterning with spacer-based metal lines that are then cut to realize more aggressive metal pitch dimensions. In cut metal processing, the drawn metal layer layout is translated into different mask implementations which include, for example, mandrel shapes (for spacer-based damascene metal etching); "cut masks" for defining the portions of the metal layer that are to be removed; and/or metal/cut decomposition color assignments (associated with multi-patterning and successive lithography/etch steps). Efforts are ongoing for reducing the need for multi-patterning of cuts and/or adjusting the cut spacing through the addition of metal extensions. According to some embodiments, the termination 706a of each of the segments 704a, 704d, 704e of the metal layer is positioned abutting a primary or secondary metal cut location 702a, 702b. In some embodiments, rather than abutting a metal cut location, the termination 706b of segment 704c overlaps a metal cut location 702b with a terminal portion 708a that will be removed during the metal cut etch. In other embodiments, rather than abutting a metal cut location, the termination 706c of segment 704b overlaps a metal cut location 702a with an intermediate portion 708b that will be removed during the metal cut etch and a residual portion 710 that will remain after a metal cut etch is completed in metal cut location 702a.

Figure 8:
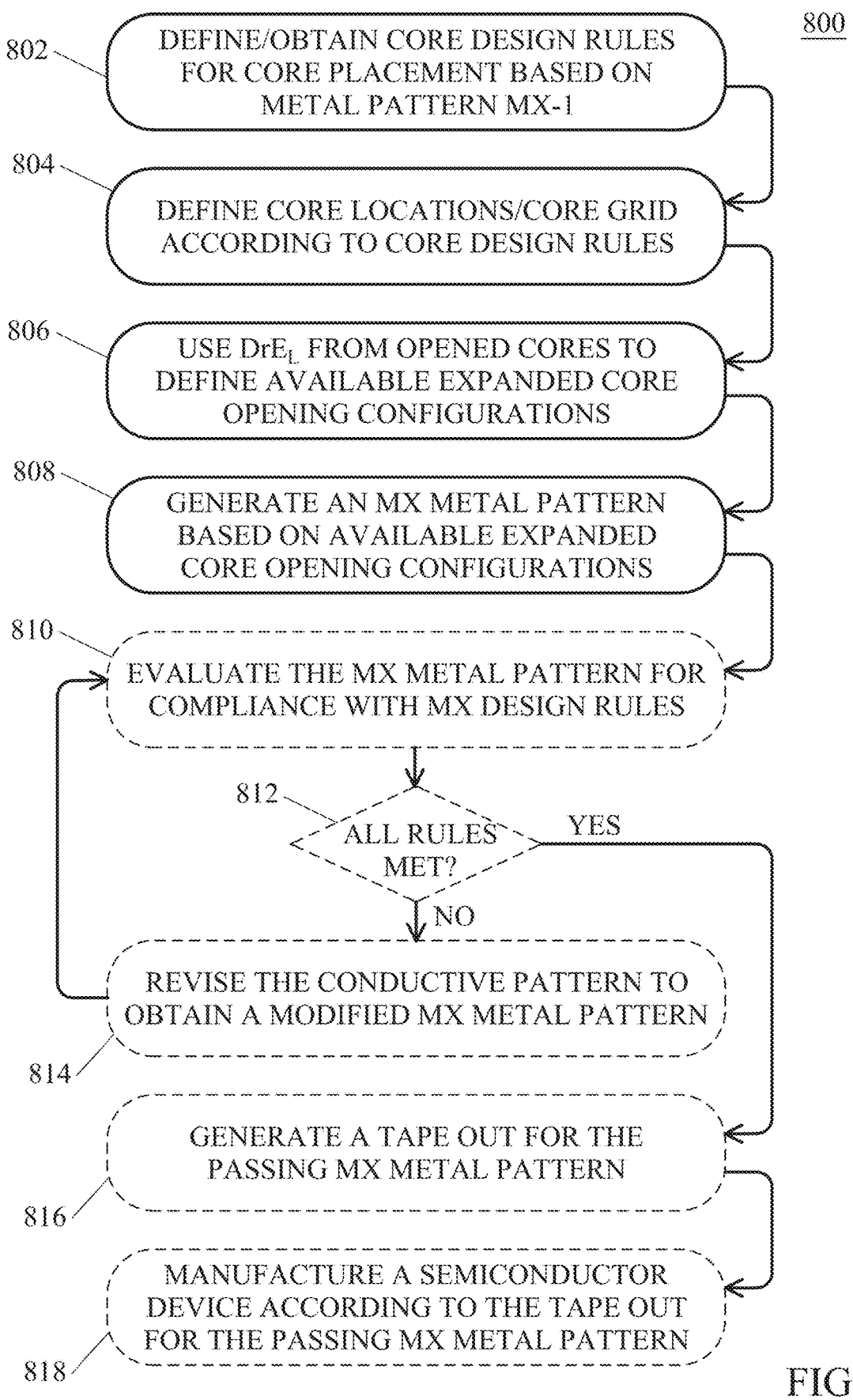
FIG. 8 is a flow diagram of a method for generating a conductive pattern in accordance with some embodiments.

FIG. 8 is a flow diagram of a method 800 for generating a conductive pattern in accordance with some embodiments including operation 802 during which a set of core design rules for defining core location placement relative to an underlying metal layer MX-1 is defined or obtained. According to some embodiments, the core design rules provide relevant spacing and sizing information for the placement and configuration of the available core locations including, for example, parameters $Pitch_{MX-1}$, $Core_w$, $Core_P$, $Core_{X_P}$, and $MX_P$.

In some embodiments, in operation 804 a plurality of core locations is defined to establish a core grid above and aligned relative to the underlying metal layer MX-1. The core design rules are used to guide the placement and configuration of the core locations defining the core grid.

In some embodiments, the $CoreX_p$ is set to correspond to an integer multiple of the metal pitch of the metal pattern underlying the core grid. Maintaining an integer multiple relationship between the underlying metal pattern, MX-1, and the core grid that is serving as the basis for contact with the next metal pattern, MX, tends to increase the number of available via locations for connecting the MX-1 and MX metal layers. In the event that an integer multiple relationship cannot be maintained between the metal pitch and the CoreX pitch of two adjacent conductive levels, some embodiments utilize MX-1 pitch to CoreX ratios that are offset by 0.5 of the CoreX pitch, e.g., 1.5, 2.5, 3.5, while some embodiments utilize other, non-integer, relationships, e.g., 1.7, 2.3, and 3.2.

Those embodiments which utilize a CoreX pitch that is an integer multiple of the metal pitch of the previous metal pattern, tend to increase the number of acceptably located vias through which contact is made to the underlying metal pattern. The regularity of the core grid and the available vias in such a configuration also simplify layout and routing operations.

In some embodiments, in operation 806, the operation of the applicable directional etching (DrE) method is taken into consideration with respect to the formation of etch extension regions that enlarge the initial dimension of opened cores along an axis to form expanded core openings. Depending on the placement and selection of the core locations and the length $DrE_L$ (also referred to as DrE push) of the etch extension regions, a designer can provide a range of expanded core opening lengths. When filled with metal (or other conductive material) the expanded core openings will produce a range of metal lines and line segments of varying length in the MX metal layer.

In some embodiments, the methods incorporate a core grid utilizing DrE expand opened cores to define the next layer (MX) metal pattern above the previous metal pattern (MX-1) without the need for a second extreme ultraviolet (EUV) pattern. Avoiding the need for a second EUV pattern, along with the associated photoresist deposition and etch, simplifies the lithography processing and avoids the associated time and expense.

In some embodiments, in operation 808, a conductive pattern for the MX metal layer is generated in light of the underlying MX-1 metal layer, opened core locations, the DrE expansion of the opened cores and metal cut locations.

In some embodiments, operation 810 encompasses the optional evaluation of the MX metal pattern for compliance with the applicable MX design rules and feeds into an optional query operation 812 during which the results of the evaluation conducted in optional operation 810 are utilized for determining the next process step.

In some embodiments, if the answer to the query in optional query operation 812 is "NO," the MX metal pattern is revised in optional operation 814 to obtain a modified MX metal pattern that addresses issues identified in the evaluation (followed by a feedback and re-evaluation of the modified MX metal pattern in operation 810).

In some embodiments, if the answer to the query in optional query operation 812 is "YES," the MX metal design is passed to optional operation 816 during which a tape out corresponding to the passing MX metal pattern is produced for use in manufacturing an IC device according to the applicable core design rules.

In some embodiments, optional operation 818 provides for the actual production of an IC device incorporating the passing MX metal pattern.

Electronic design automation (EDA) tools are used in some embodiments of integrated circuit (IC) design flows for placing standard cells (predefined cells that implement desired logic or other electronic functions) and conductive patterns defining an IC layout design during an automatic placement and routing (APR) operation. Some APR operations include one or more sub-operations including, for example, generating a floor plan, initial placement, clock tree synthesis (CTS), initial routing, and post-routing. In some embodiments, the APR operation starts with obtaining inputs, including standard operational and power/ground cells from one or more cell libraries and/or a functional design, e.g., a register transfer level (RTL) design. In some embodiments, the APR operation ends with one or more outputs including, e.g., one or more IC design layouts that can be converted into a mask work in a graphic database system (GDS) format or any other suitable formats including, for example, the open artwork system interchange standard (OASIS) format.

Figure 9:
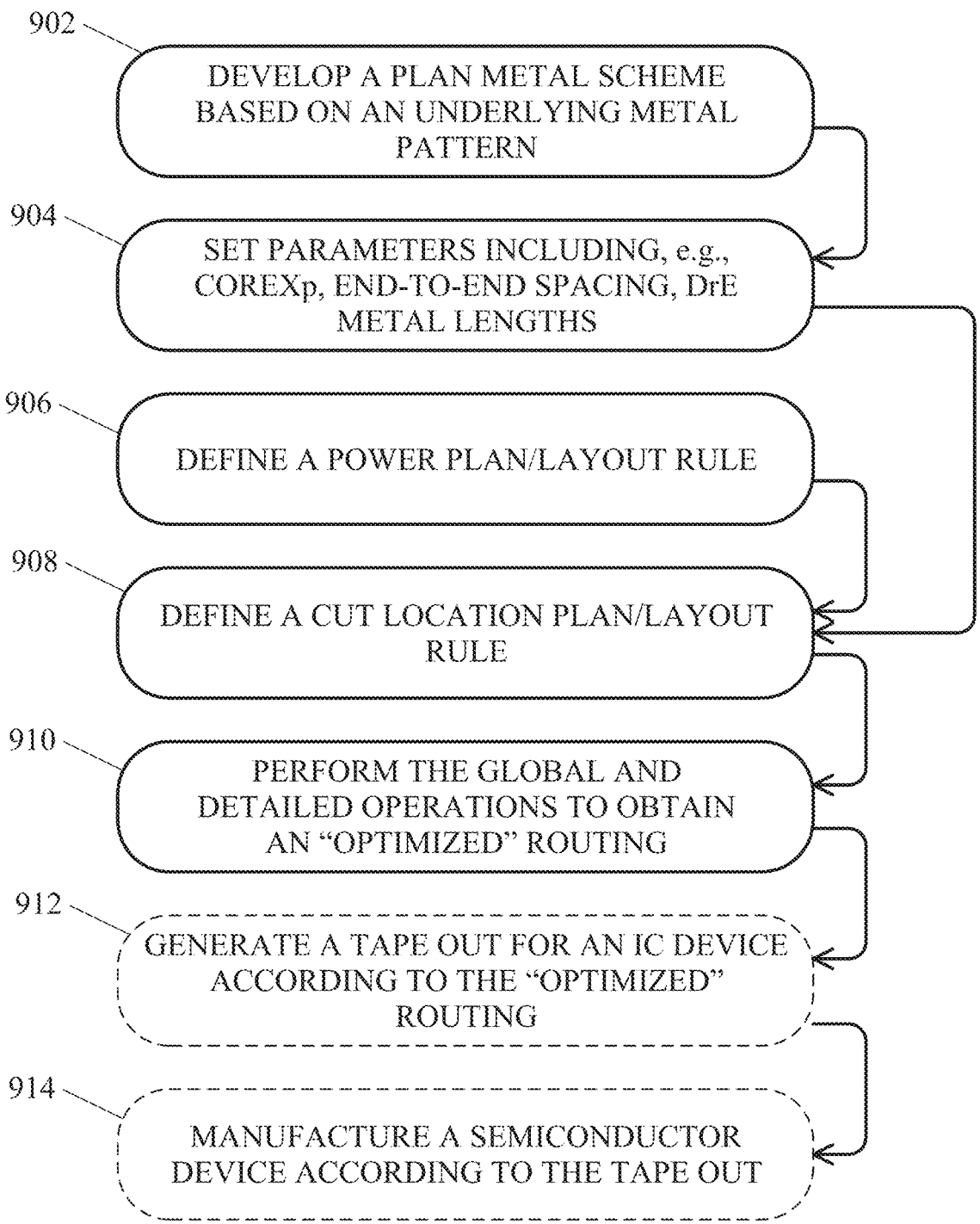
FIG. 9 is a flow diagram of an automated placement and routing (APR) method for generating a conductive pattern in accordance with some embodiments.

FIG. 9 is a flow diagram of an automated placement and routing (APR) method 900 for generating a conductive pattern in accordance with some embodiments including operation 902 during which a plan metal scheme is developed in light of an underlying metal layer MX-1, comprising a first set of signal lines, including establishing parameters for the layout of the next metal layer MX. The plan metal scheme encompasses the relevant metal, contact, and via, design rules for the applicable technology node(s).

In operation 904, various parameters, including $CoreX_P$, metal EtE, directional etch length $DrE_L$, and target metal length(s) and spacings are established for metal layer MX. In addition to the signal line parameters, during operation 906 a distribution plan and/or layout rules compatible with the signal line configuration are defined for power transmission in metal layer MX. In some embodiments, in addition to and compatible with the signal and power line layout parameters/rules, operation 908 defines metal cut locations/layout rules.

In operation 910, the signal line plan/layout rules, power line plan/layout rules, and metal cut locations/layout rules are used in performing both global and detailed routing operations to obtain a comprehensive functional metal layer routing. In some embodiments, operation 910 includes additional analysis, evaluation, and/or iteration, in order to obtain an improved version of the metal layer MX layout. In some embodiments, the metal layer MX layout generated in operation 910 is passed to optional operation 912 during which a tape out corresponding to the metal layer MX layout is produced for use in manufacturing an IC device according to the applicable metal layout rules. Optional operation 914 provides for the actual production of an IC device incorporating the metal layer MX layout output from operation 910.

Figure 10:
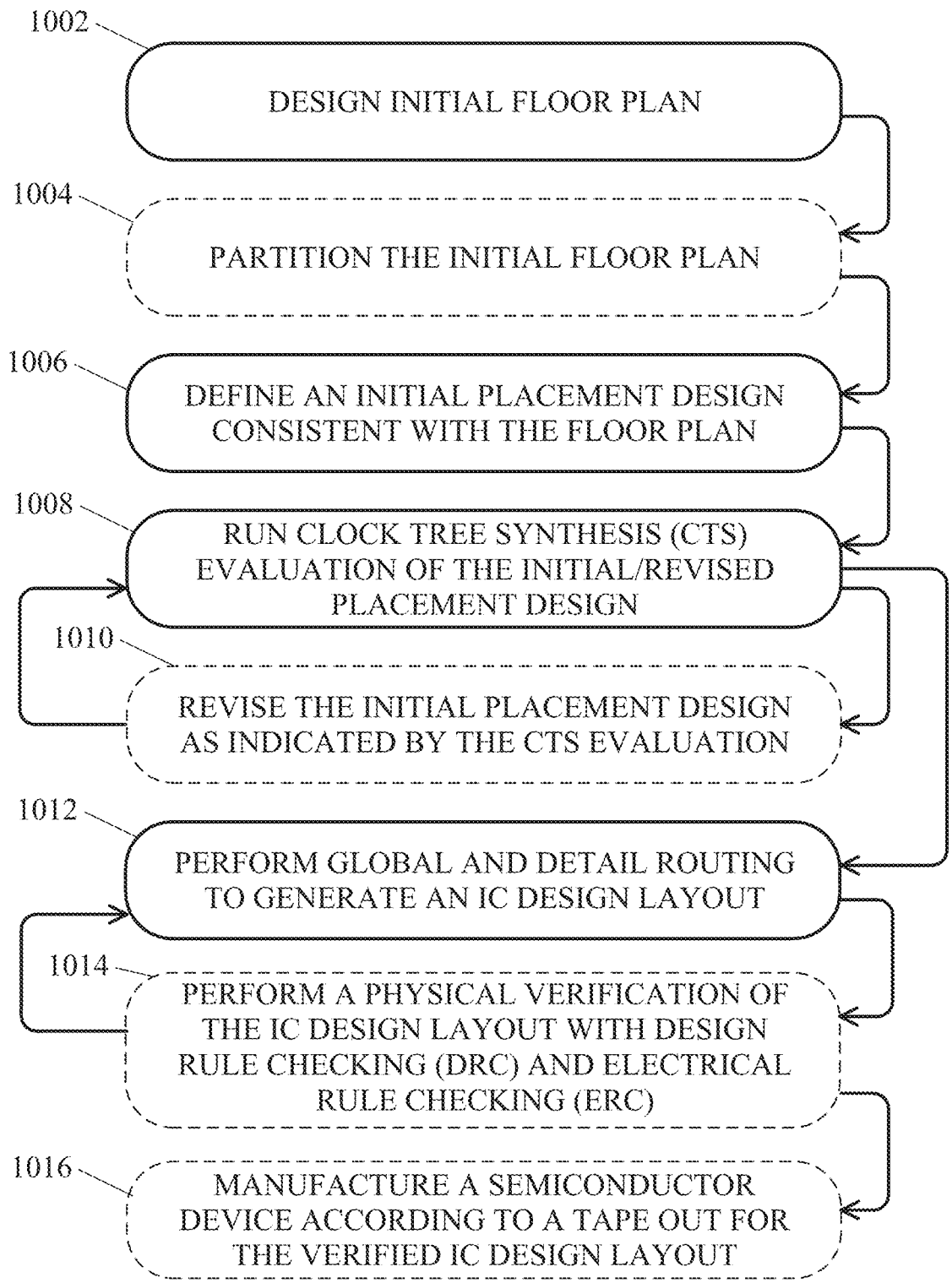
FIG. 10 is a flow diagram of a method for generating a conductive pattern in accordance with some embodiments.

FIG. 10 is a flow diagram of a method 1000 for generating one or more conductive metal pattern(s) in accordance with some embodiments and includes operation 1002 during which an initial floorplan is designed, retrieved, or input for use in the method. The floorplanning operation includes identifying and/or selecting certain structures for placement in various regions of the IC design layout to obtain a suitable layout that provides a satisfactory balance of often conflicting parameters of power, performance, and area (PPA) (and cost) for the IC layout design. Based on the area available and the hierarchy of function/operation, a suitable floorplan considers variables including, e.g., the logic, processing, and/or memory regions, other IP cores, the routing and cut metal options, to determine the entire IC layout design including the input/output (TO) structure and aspect ratio of the IC layout design.

Floorplanning also takes into consideration some of the geometrical limitations for a particular design including, for example, bonding pads for external connections are typically arranged around the periphery of the device, line drivers are typically located close to the bonding pads; functional areas are clustered in order to limit data path lengths between and among structures including, for example, RAM, multiplier(s), barrel shifter(s), line driver(s) and arithmetic logic unit(s) (ALU), and/or processor core(s).

In some embodiments, an optional step 1004 is used for partitioning the initial floorplan. The partitioning (or logical partitioning) operation during which the IC layout design produced by the floor planning operation is divided into smaller blocks to refine the design to separate different functional blocks to improve subsequent operations. In some embodiments, the partitioning operation occurs in conjunction with the RTL design operation when the design engineer partitions the entire IC design layout into sub-modules and then designs each sub-module. In some embodiments, certain of these sub-modules are then combined to form a main or top level module.

In operation 1006, the initial floor plan (or the partitioned version of the floor plan) is used to define an initial placement design of the functional elements that are to be included in the metal pattern. The placement operation is an iterative process typically utilizing resistance and capacitance (RC) values from virtual routing (VR) for calculating the timing effects resulting from a potential placement design using the shortest Manhattan distance (the distance between two points measured along axes oriented perpendicular to each other) between two nodes. In some embodiments, the placement operation includes four optimization phases including, pre-placement optimization (PrPO), in placement optimization, post placement optimization (PPO) before (CTS), and PPO after CTS.

PrPO optimizes a netlist corresponding to the IC design layout (information on the cells used, their interconnections, area used, and other details of the IC design layout). In-placement optimization re-optimizes the logic based on the corresponding VR results and, in some embodiments, includes operations including one or more of cell sizing, cell moving, cell bypassing, net splitting, gate duplication, buffer insertion, and area recovery. The optimization operations perform an iteration of setup fixing, incremental timing, and congestion driven placement. PPO before CTS performs a netlist-based optimization with ideal clocks. PPO after CTS optimizes timing with propagated clock to account for, e.g., clock skew.

In operation 1008 the initial placement design is subjected to a clock tree synthesis (CTS) evaluation. An initial placement design that exhibits acceptable CTS performance may be passed on to operation 1012 during which global and detailed routing operations are conducted to obtain a conductive metal pattern. The goal of clock tree synthesis (CTS) is to minimize skew and insertion delay during operation of an IC device manufactured in accord with the IC design layout. In some embodiments, the clock signal is global with the same metal layer being used for both power routing and the clock signal. In some embodiments, clock tree optimization (CTO) is achieved by adjustments to one or more of the buffer sizing(s), gate sizing(s), buffer relocations, level adjustment(s) and high fanout net (HFN) synthesis.

If the initial placement design does not exhibit acceptable CTS performance, the initial placement design is passed to optional operation 1010 during which the initial placement design is revised to address issues identified during the CTS evaluation and generate a revised placement design. The revised placement design is then returned to operation 1008 for CTS evaluation. In some embodiments, the revision/re-evaluation loop involves two or more passes through the operations 1010/1008 before achieving a revised placement design that exhibits the desired CTS performance. The routing operation typically includes both a global routing operation and a detailed routing operation. In some embodiments, the global routing operation allocates routing resources that are used for connections. It also does track assignment for a particular net. Detailed routing generates the actual connections. Different design constraints addressed during the routing operation in some embodiments include, for example, design rule checking (DRC), wire length, and signal timing.

In some embodiments, the conductive metal pattern/IC device layout are passed to optional operation 1014 during which the conductive metal pattern/IC device layout is subjected to a physical verification of the design with DRC and/or ERC sub-operations included as an aspect of the physical verification. In some embodiments, the conductive metal patterns/IC device layouts that pass the physical verification operation are passed back to operation 1012 for revision of the conductive metal patterns/IC device layouts in an effort to address issues noted during the optional physical verification operation 1014. The physical verification operation is used for checking the accuracy and functionality of the generated layout design. This physical verification operation typically includes verifying that the generated layout design complies with all technology requirements, e.g., sizings, spacings, offsets, power, and density, that the generated layout design is consistent with the original netlist (layout v. schematic (LVS)), exhibits no unintended antenna effects or sensitivities (antenna rule checking (ARC)), that the generated layout design complies with all electrical requirements (electrical rule checking (ERC)).

In some embodiments, IC device layout that pass the physical verification of the design, with or without DRC and/or ERC sub-operations, may be passed to optional operation 1016 for the manufacture of an IC device corresponding to the layout.

Figure 11:
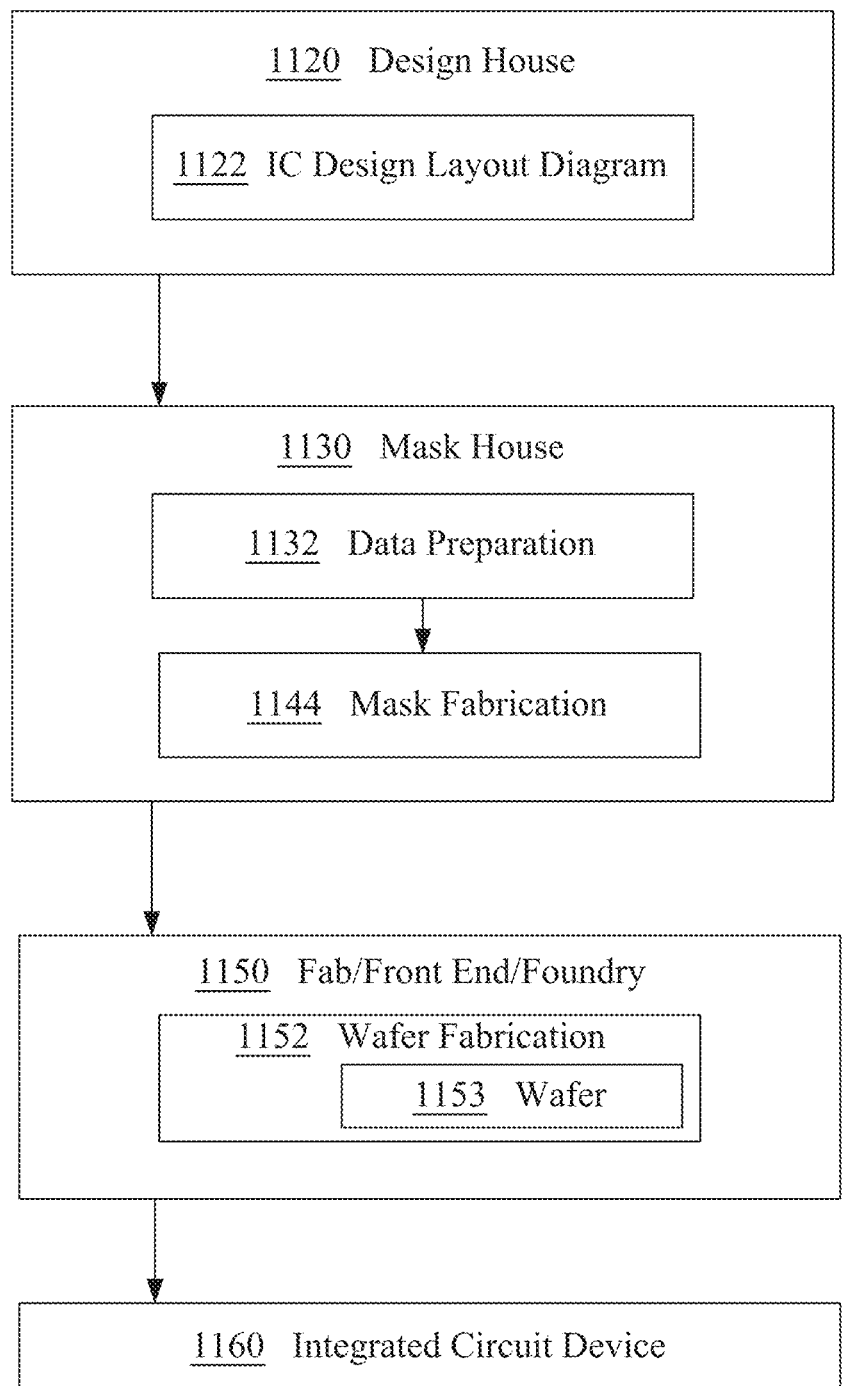
FIG. 11 is a flow diagram of a manufacturing process for an integrated circuit in accordance with some embodiments.

FIG. 11 is a block diagram of an integrated circuit (IC) manufacturing system 1120, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using IC manufacturing system 1100.

In FIG. 11, IC manufacturing system 1100 includes entities, such as a design house 1120, a mask house 1130, and an IC manufacturer/fabricator (FAB or fab) 1150, that interact with one another in the design, development, and manufacturing cycles and/or services related to manufacturing an IC device 1160. The entities in system 1100 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1120, mask house 1130, and IC fab 1150 is owned by a single larger company. In some embodiments, two or more of design house 1120, mask house 1130, and IC fab 1150 coexist in a common facility and use common resources.

Design house (or design team) 1120 generates an IC design layout diagram 1122. IC design layout diagram 1122 includes various geometrical patterns designed for an IC device 1160. The geometrical patterns correspond to patterns of metal, oxide, or semiconductor layers that make up the various components of IC device 1160 to be fabricated. The various layers combine to form various IC features. For example, a portion of IC design layout diagram 1122 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1120 implements a proper design procedure to form IC design layout diagram 1122. The design procedure includes one or more of logic design, physical design or place and route. IC design layout diagram 1122 is presented in one or more data files having information of the geometrical patterns. For example, IC design layout diagram 1122 is be expressed in a GDSII file format or DFII file format, according to some embodiments.

Mask house 1130 includes data preparation 1132 and mask fabrication 1144. Mask house 1130 uses IC design layout diagram 1122 to manufacture one or more masks to be used for fabricating the various layers of IC device 1160 according to IC design layout diagram 1122. Mask house 1130 performs mask data preparation 1132, where IC design layout diagram 1122 is translated into a representative data file (RDF). Mask data preparation 1132 provides the RDF to mask fabrication 1144. Mask fabrication 1144 includes a mask writer. A mask writer converts the RDF to an image on a substrate, such as a mask (reticle) 1145 or a semiconductor wafer 1153. The IC design layout diagram 1122 is manipulated by mask data preparation 1132 to comply with particular characteristics of the mask writer and/or requirements of IC fab 1150. In FIG. 11, mask data preparation 1132 and mask fabrication 1144 are illustrated as separate elements. In some embodiments, mask data preparation 1132 and mask fabrication 1144 are collectively referred to as mask data preparation.

In some embodiments, mask data preparation 1132 includes optical proximity correction (OPC) which uses lithography enhancement techniques to compensate for image errors, such as those that arise from diffraction, interference, other process effects and the like. OPC adjusts IC design layout diagram 1122. In some embodiments, mask data preparation 1132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1132 includes a mask rule checker (MRC) that checks the IC design layout diagram 1122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1122 to compensate for limitations during mask fabrication 1144, which undoes part of the modifications performed by OPC in order to meet mask creation rules.

In some embodiments, mask data preparation 1132 includes lithography process checking (LPC) that simulates processing that will be implemented by IC fab 1150 to fabricate IC device 1160. LPC simulates this processing based on IC design layout diagram 1122 to create a simulated manufactured device, such as IC device 1160. In some embodiments, the processing parameters in LPC simulation include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1122.

One of ordinary skill in the art would understand that the above description of mask data preparation 1132 has been simplified for the purposes of clarity. In some embodiments, data preparation 1132 includes additional features such as a logic operation (LOP) to modify the IC design layout diagram 1122 according to manufacturing rules. Additionally, the processes applied to IC design layout diagram 1122 during data preparation 1132 is executed in a variety of different orders, according to some embodiments.

After mask data preparation 1132 and during mask fabrication 1144, a mask 1145 or a group of masks 1145 are fabricated based on the modified IC design layout diagram 1122. In some embodiments, mask fabrication 1144 includes performing one or more lithographic exposures based on IC design layout diagram 1122. In some embodiments, an electron-beam (e-beam) or a mechanism of multiple e-beams is used to form a pattern on a mask (photomask or reticle) 1145 based on the modified IC design layout diagram 1122. In some embodiments, mask 1145 is formed in various technologies. In some embodiments, mask 1145 is formed using binary technology. In some embodiments, a mask pattern includes opaque regions and transparent regions.

A radiation beam, such as an ultraviolet (UV) or extreme ultraviolet (EUV) beam, used to expose the image sensitive material layer (e.g., photoresist) which has been coated on a wafer, is blocked by the opaque region and transmits through the transparent regions. In one example, a binary mask version of mask 1145 includes a transparent substrate (e.g., fused quartz) and an opaque material (e.g., chromium) coated in the opaque regions of the binary mask. In another example, mask 1145 is formed using a phase shift technology. In a phase shift mask (PSM) version of mask 1145, various features in the pattern formed on the phase shift mask are configured to have proper phase difference to enhance the resolution and imaging quality. In various examples, the phase shift mask is attenuated PSM or alternating PSM. The mask(s) generated by mask fabrication 1144 is used in a variety of processes. For example, such a mask(s) is used in an ion implantation process to form various doped regions in semiconductor wafer 1153, in an etching process to form various etching regions in semiconductor wafer 1153, and/or in other suitable processes.

IC fab 1150 includes wafer fabrication 1152. IC fab 1150 is an IC fabrication business that includes one or more manufacturing facilities for the fabrication of a variety of different IC products. In some embodiments, IC fab 1150 is a semiconductor foundry. For example, according to some embodiments, a manufacturing facility for the front end fabrication of a plurality of IC products (front-end-of-line (FEOL) fabrication), while a second manufacturing facility is provided the back end fabrication for the interconnection and packaging of the IC products (back-end-of-line (BEOL) fabrication), and a third manufacturing facility is provided other services for the foundry business.

In some embodiments of the present disclosure, fin dimensional adjustment includes operations associated with making an array of fins across an entirety of the fin-containing functional areas of the integrated circuit, followed by modification of fin dimensions in at least one fin-containing functional area of the integrated circuit. In some embodiments of the present disclosure, the fins of different fin-containing functional areas are formed to a final fin shape or fin dimensional profile separately, in a single fin-formation manufacturing flow for each fin-containing functional area of the IC. In some embodiments, the fin dimension adjustment occurs by forming fins in a layer of fin material, or fin substrate, by applying mask layer to a top surface of the fin material, patterning the mask layer with a pattern that corresponds to the locations of fins in one or more of the fin-containing functional areas, exposing a top surface of the fin material through the mask layer, and etching the fin material to form fins in the fin substrate. In some embodiments, the fins are formed in a single functional area of the IC with a final fin dimension, the selected fin dimension (or, fin height) as described above in operation 1150.

A patterned layer of mask material formed on a semiconductor substrate is made of a mask material that includes one or more layers of photoresist, polyimide, silicon oxide, silicon nitride (e.g., $Si_3N_4$), SiON, SiC, SiOC, or combinations thereof. In some embodiments, masks include a single layer of mask material. In some embodiments, a mask includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, fins of areas not covered by the mask, or fins in open areas of the pattern, are etched to modify a fin dimension. In some embodiments, the etching is performed on a top surface of fins with fin sides that are completely covered by adjoining dielectric support material deposited between fins in a previous manufacturing step. Etching of top surfaces of fins is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethyl-ammonium hydroxide), or a combination thereof. In some embodiments, etching the fins is performed by exposing an upper portion of fin material, extending above a top surface of a dielectric support medium deposited between fins and recessed below a top surface of the fin height in a prior manufacturing step, to a liquid chemical etch solution comprising one or more of the liquid chemical etchants described above. An upper portion of the fin material includes a top surface and sides of the fin material.

In some embodiments, the etching process is a dry-etch or plasma etch process. Plasma etching of a substrate material is performed using halogen-containing reactive gasses excited by an electromagnetic field to dissociate into ions. Reactive or etchant gases include $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed fin material by alternating electromagnetic fields or by fixed bias according to methods of plasma etching that are known in the art.

In some embodiments, etching processes include presenting the exposed portions of fins of the functional area in an oxygen-containing atmosphere to oxidize an outer portion of the fin material, followed by a chemical trimming process such as plasma-etching or liquid chemical etching, as described above, to remove the oxidized semiconductor fin material and leave a modified fin behind. In some embodiments, fin oxidation followed by chemical trimming is performed to provide greater selectivity to the fin material and to reduce a likelihood of accidental fin material removal during a manufacturing process. In some embodiments, the exposed portions of fins of the functional area are top surfaces of the fins, the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC fab 1150 uses mask(s) 1145 fabricated by mask house 1130 to fabricate IC device 1160. Thus, IC fab 1150 at least indirectly uses IC design layout diagram 1122 to fabricate IC device 1160. In some embodiments, semiconductor wafer 1153 is fabricated by IC fab 1150 using mask(s) 1145 to form IC device 1160. In some embodiments, the IC fabrication includes performing one or more lithographic exposures based at least indirectly on IC design layout diagram 1122. Semiconductor wafer 1153 includes a silicon substrate or other proper substrate having material layers formed thereon. Semiconductor wafer 1153 further includes one or more of various doped regions, dielectric features, multilevel interconnects, and the like (formed at subsequent manufacturing steps).

Details regarding an integrated circuit (IC) manufacturing system (e.g., system 1100 of FIG. 11), and an IC manufacturing flow associated therewith are found, e.g., in U.S. Pat. No. 9,256,709, granted Feb. 9, 2016, U.S. Pre-Grant Pub. No. 20150278429, published Oct. 1, 2015, U.S. Pre-Grant Pub. No. 20140040838, published Feb. 6, 2014, and U.S. Pat. No. 7,260,442, granted Aug. 21, 2007, each of which are hereby incorporated, in their entireties, by reference.

Figure 12:
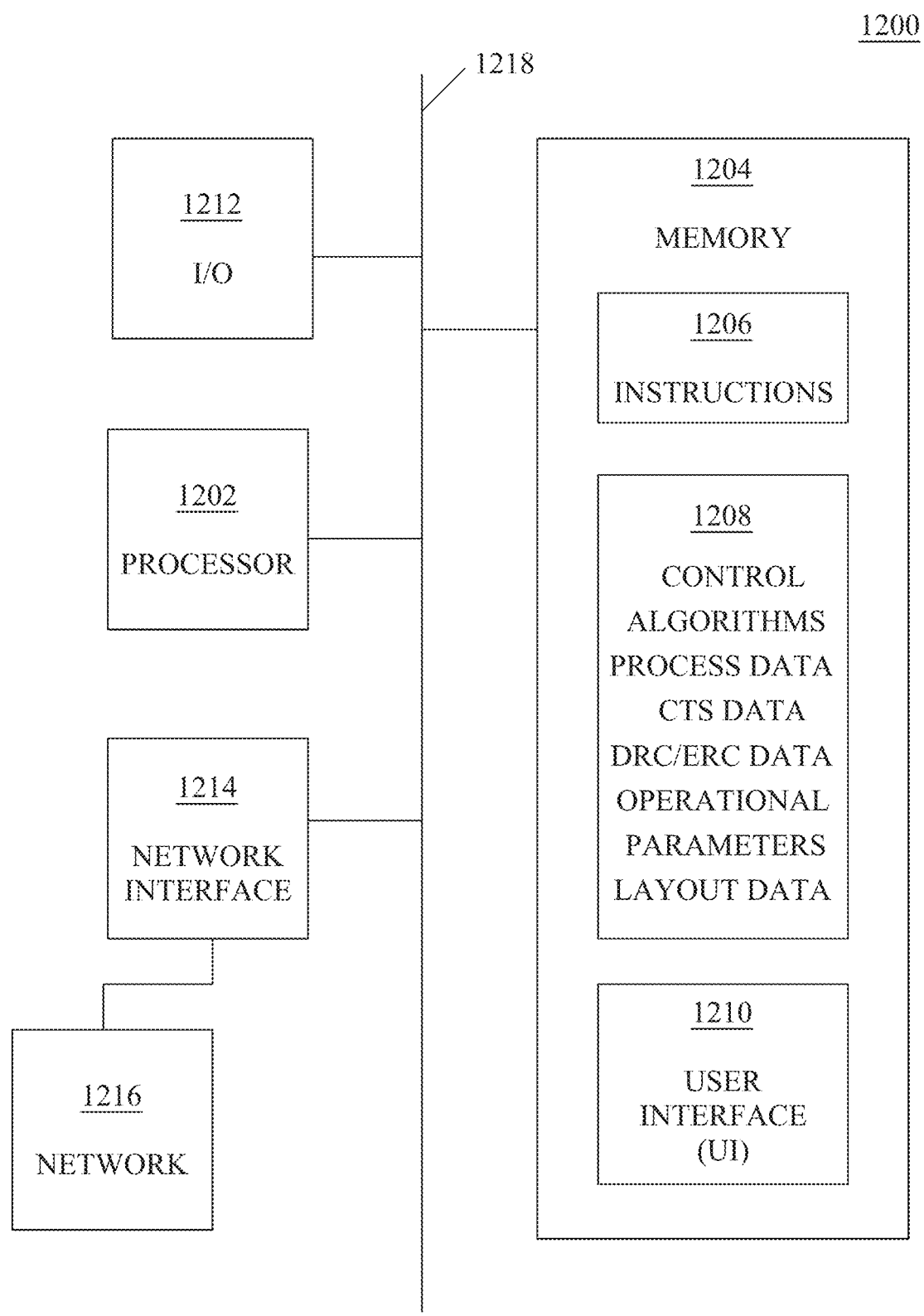
FIG. 12 is a block diagram of an electronic process control (EPC) system in accordance with some embodiments.

FIG. 12 is a block diagram of an electronic process control (EPC) system 1200, in accordance with some embodiments. Methods described herein of generating cell layout diagrams, in accordance with one or more embodiments, are implementable, for example, using EPC system 1200, in accordance with some embodiments. In some embodiments, EPC system 1200 is a general purpose computing device including a hardware processor 1202 and a non-transitory, computer-readable storage medium 1204. Storage medium 1204, amongst other things, is encoded with, i.e., stores, computer program code (or instructions) 1206, i.e., a set of executable instructions. Execution of computer program code 1206 by hardware processor 1202 represents (at least in part) an EPC tool which implements a portion or all of the methods described herein in accordance with one or more embodiments (hereinafter, the noted processes and/or methods).

Hardware processor 1202 is electrically coupled to computer-readable storage medium 1204 via a bus 1218. Hardware processor 1202 is also electrically coupled to an I/O interface 1212 by bus 1218. A network interface 1214 is also electrically connected to hardware processor 1202 via bus 1218. Network interface 1214 is connected to a network 1216, so that hardware processor 1202 and computer-readable storage medium 1204 are capable of connecting to external elements via network 1216. Hardware processor 1202 is configured to execute computer program code 1206 encoded in computer-readable storage medium 1204 in order to cause EPC system 1200 to be usable for performing a portion or all of the noted processes and/or methods. In one or more embodiments, hardware processor 1202 is a central processing unit (CPU), a multi-processor, a distributed processing system, an application specific integrated circuit (ASIC), and/or a suitable processing unit.

In one or more embodiments, computer-readable storage medium 1204 is an electronic, magnetic, optical, electromagnetic, infrared, and/or a semiconductor system (or apparatus or device). For example, computer-readable storage medium 1204 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1204 includes a compact disk-read only memory (CD-ROM), a compact disk-read/write (CD-R/W), and/or a digital video disc (DVD).

In one or more embodiments, storage medium 1204 stores computer program code 1206 configured to cause EPC system 1200 (where such execution represents (at least in part) the EPC tool) to be usable for performing a portion or all of the noted processes and/or methods. In one or more embodiments, storage medium 1204 also stores information which facilitates performing a portion or all of the noted processes and/or methods. In one or more embodiments, storage medium 1204 stores process control data 1208 including, in some embodiments, control algorithms, active area data, transition cell data, uniformity algorithms, layout data, and constants, target ranges, set points, and code for enabling statistical process control (SPC) and/or model predictive control (MPC) based control of the various processes.

EPC system 1200 includes I/O interface 1212. I/O interface 1212 is coupled to external circuitry. In one or more embodiments, I/O interface 1212 includes a keyboard, keypad, mouse, trackball, trackpad, touchscreen, and/or cursor direction keys for communicating information and commands to hardware processor 1202.

EPC system 1200 also includes network interface 1214 coupled to hardware processor 1202. Network interface 1214 allows EPC system 1200 to communicate with network 1216, to which one or more other computer systems are connected. Network interface 1214 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 1200.

EPC system 1200 is configured to receive information through I/O interface 1212. The information received through I/O interface 1212 includes one or more of instructions, data, design rules, process performance histories, target ranges, set points, and/or other parameters for processing by hardware processor 1202. The information is transferred to hardware processor 1202 via bus 1218. EPC system 1200 is configured to receive information related to a user interface (UI) through I/O interface 1212. The information is stored in computer-readable storage medium 1204 as user interface (UI) 1210.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 1200.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD or CD, a magnetic disk, such as a hard disk, a semiconductor memory, such as a ROM, a RAM, a memory card, memory stick, and/or any suitable data storage device.

Figure 13A:
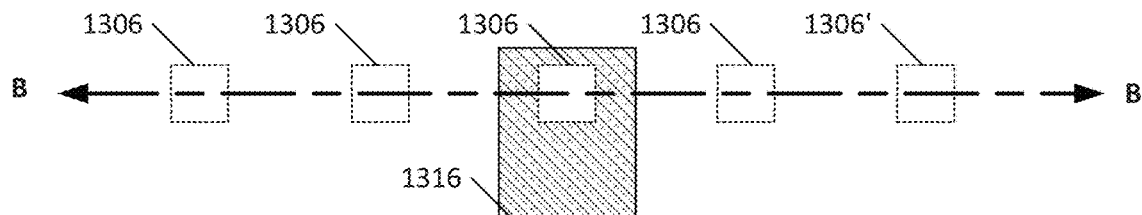
FIG. 13A is a top view of a core grid according to some embodiments in which a core has been extended through a directed etch and filed with a conductive material.
Figure 13B:
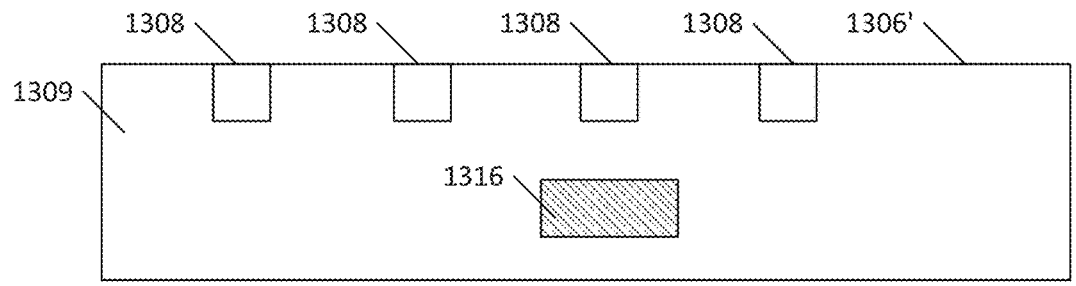
FIGS. 13B-D are cross-sectional views of FIG. 13A taken along axis B-B at intermediate points of an embodiment of the manufacturing process.
Figure 13C:
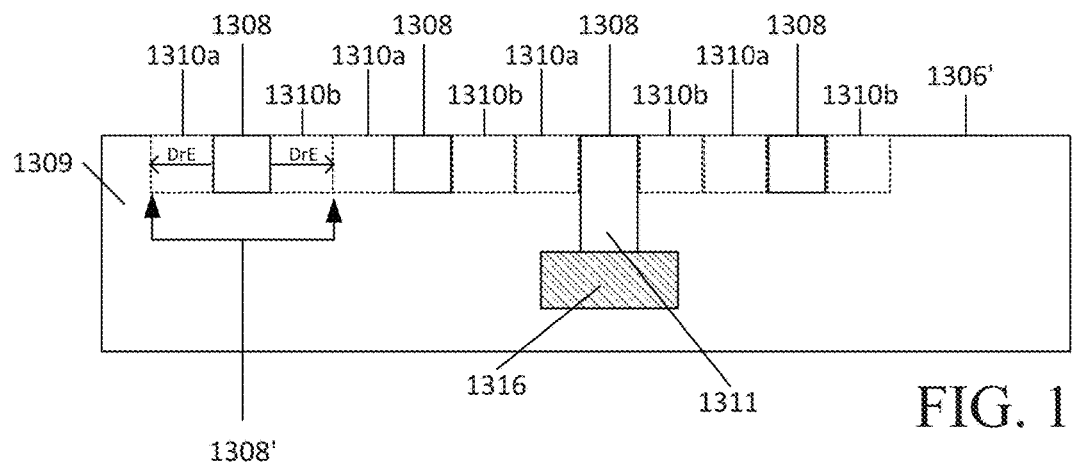
Figure 13D:
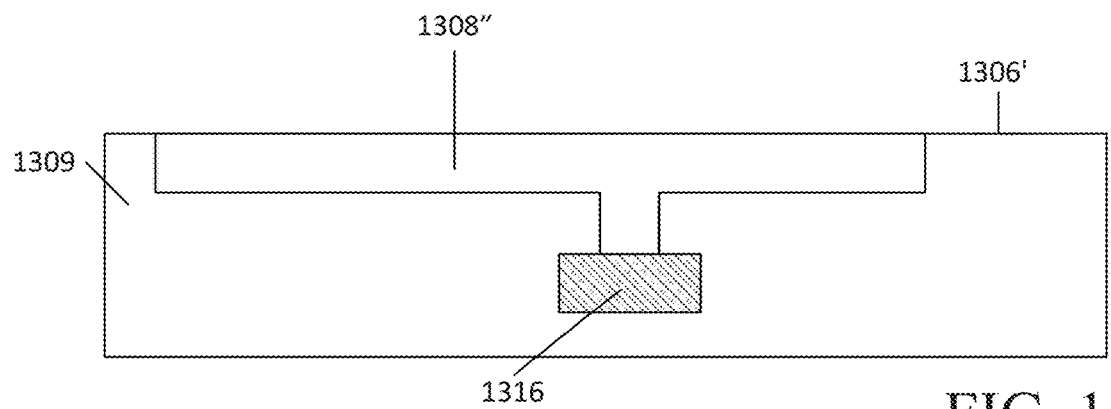
Figure 13E:
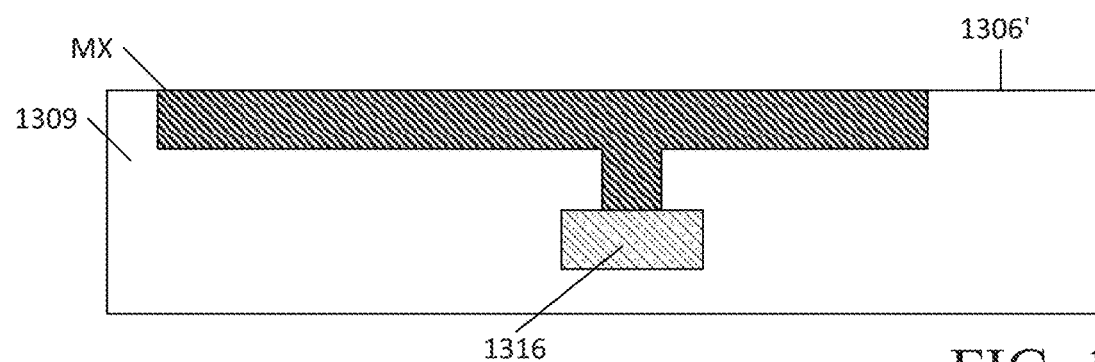

FIG. 13A is a top view of a core grid 1300 according to some embodiments in which an underlying metal layer MX-1 1316 is formed and then covered with a dielectric material, e.g., an interlayer dielectric (ILD) layer 1309, on which core locations 1306, 1306' are configured with a predetermined Pitch$_{MX-1}$: Core$_{Xp}$ ratio. FIG. 13B is a cross-sectional view of the core grid 1300 of FIG. 13A taken along axis B-B as in accordance with some embodiments in which the ILD layer 1309 in certain of the core locations 1306 have been etched to form opened cores 1308, while in other of the core locations 1306' which are not opened, the full thickness of the ILD remains. FIG. 13C is a cross-sectional view of the core grid 1300 of FIG. 13A taken along axis B-B subsequent to FIG. 13B in which an opened core 1308 that will be used as a via has received a subsequent etch to form the via opening 1311 and expose surface regions of the metal layer MX-1 1316. Each of the opened cores 1308 are then expanded using a direction etching process to open extension regions 1310a, 1310b to form a plurality of expanded opened cores 1308'. FIG. 13D is a cross-sectional view of the core grid 1300 of FIG. 13A taken along axis B-B subsequent to FIG. 13C in which the extension regions 1310a, 1310b have been opened to a degree whereby the regions of the ILD remaining between the initially opened cores 1308 has been removed using a DrE to form a final opened core 1308". FIG. 13E is a cross-sectional view of the core grid 1300 of FIG. 13A taken along axis B-B subsequent to FIG. 13D in which the final opened core 1308" has been filled with metal layer MX and planarized to remove the overburden of MX to produce an elongated metal conductor in contact with, and extending beyond the boundaries of, a portion of the underlying metal layer MX-1 1316.

According to some embodiments, a semiconductor device is manufactured using a method including the steps of defining a first metal pattern (MX-1) having a first metal pattern pitch (MX-$1_P$); depositing an insulating layer over the first metal pattern; defining a core grid having a plurality of core locations having a pitch CoreX$_P$; removing portions of the insulating layer to form a plurality of opened cores in a predetermined portion of the core locations; and etching the opened cores using a directional etch to form expanded core openings. According to some embodiments, a ratio of CoreX$_P$ to MX-$1_P$ is an integer, defining the core grid comprises arranging a first group of core locations along a first axis and arranging a second group of core locations along a second axis, wherein the first axis is parallel to the second axis, with the first and second axes being separated by a second metal pitch MX$_P$. According to some embodiments, the method a first group of core locations that is offset from the second group of core locations in a horizontal direction. According to some embodiments, the first group of core locations is offset from the second group of core locations in a horizontal direction by an offset distance equal to ½*CoreX$_P$. According to some embodiments, the opened cores have an initial width Core$_w$ and are elongated using a directional etch length of DrE$_L$ to elongating the opened cores to produces elongated openings having a final width of Core$_W$+2*DrE$_L$. According to some embodiments, the directional etch length DrE$_L$ satisfies a mathematical relationship [2*DrE$_L$>CoreX$_P$] the directional etch length DrE$_L$ satisfies a mathematical relationship [2*DrE$_L$≥(1.2)*CoreX$_P$]. According to some embodiments a conductive material is deposited or formed in the elongated openings to form a portion of a second metal pattern (MX).

According to some embodiments, a system for manufacturing a semiconductor device includes a processor configured for receiving an integrated circuit design, generating a first metal pattern (MX-1) for the integrated circuit design, the first metal pattern having a first metal pattern pitch (MX-$1_P$); defining a core grid of core locations having a core pitch (CoreX$_P$); and generating a second metal pattern (MX) for the integrated circuit design, the second metal pattern having a second metal pattern pitch (MX$_P$), wherein portions of the second metal pattern align with a plurality of core locations. According to some embodiments, the system further comprising: a memory configured for storing the integrated circuit design; and a communications link between the memory and the processor. According to some embodiments, also includes an etching apparatus for etching a core location to form an opened core; and a directional etching (DrE) apparatus configured for enlarging the opened core along a first axis to produce an expanded core opening, a deposition apparatus configured for depositing a conductive material into the expanded core opening, and/or a chemical-mechanical planarization (CMP) apparatus configured for removing an overburden of the conductive material and form the second metal pattern. According to some embodiments, the system processor is also configured (or may be configured) for determining a horizontal offset distance between the first and second metal patterns.

According to some embodiments, a semiconductor device constructed according to the methods will include a first metal pattern (MX-1) having a first metal pattern pitch (MX-$1_P$) and being arranged along a number of parallel first axes; an insulating layer formed or deposited over the first metal pattern; a plurality of opened cores arranged along a second axis having a core pitch (CoreX$_P$) through the insulating layer, with the second axis being perpendicular to the first axes; a number of expanded core openings produced by the directional etching of the opened cores; and a conductive composition (e.g., metal) filling the expanded core openings forming a second metal pattern (MX). According to some embodiments, the semiconductor device has a ratio between CoreX$_P$ and MX-$1_P$ is an integer ratio, e.g., 2:1, 3:1, but according to some embodiments the integer is not larger than 4, and in other embodiments the ratio (R$_P$) between CoreX$_P$ and MX-$1_P$ along at least one of a number of parallel horizontal axes is not an integer, e.g., 1.5:1 and/or 2.3:1. According to some embodiments, the plurality of opened cores form a core opening array that is, in turn, shifted (or offset) in a horizontal direction by an offset distance D$_O$ from the first metal pattern. According to some embodiments, the relationship between the values of the distances CoreX$_P$ and MX-$1_P$ and the value of the offset distance D$_O$, in the same units of measurement ("unit") as CoreX$_P$ and MX-$1_P$, satisfies a relationship whereby the value of the expression (CoreX$_P$/MX-$1_P$)−(D$_O$/1 unit) is an integer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

We claim:

1. A method of manufacturing a semiconductor device, the method comprising:
    defining a first metal pattern (MX-1) having a first metal pattern pitch (MX-$1_P$);
    depositing an insulating layer over the first metal pattern;
    defining a core grid having a plurality of core locations having a coreX pitch (CoreX$_P$);
    removing portions of the insulating layer to form a plurality of core openings in a predetermined portion of the core locations; and
    etching the core openings using a directional etch (DrE) to form expanded core openings.

2. The method of manufacturing a semiconductor device according to claim 1, further comprising:
establishing a ratio of $CoreX_P$ to $MX\text{-}1_P$ that is an integer.

3. The method of manufacturing a semiconductor device according to claim 1, further comprising:
depositing a conductive material in the elongated openings to form a portion of a second metal pattern (MX).

4. The method of manufacturing a semiconductor device according to claim 1, wherein:
defining the core grid comprises:
arranging a first group of core locations along a first axis and
arranging a second group of core locations along a second axis,
wherein the first axis is parallel to the second axis, and wherein the first and second axes are separated by a second metal pitch $MX_P$.

5. The method of manufacturing a semiconductor device according to claim 4, further comprising:
the first group of core locations is offset from the second group of core locations in a horizontal direction.

6. The method of manufacturing a semiconductor device according to claim 5, wherein:
shifting the first group of core locations relative to the second group of core locations in a horizontal direction by an offset distance equal to $½ * CoreX_P$.

7. The method of manufacturing a semiconductor device according to claim 1, wherein:
the core openings have an initial core opening length $Core_W$;
elongating the core openings increases the initial core opening length in a horizontal direction by a directional etch length of $DrE_L$; and
elongating the initial core openings produces elongated core openings having a final minimum length of $Core_W + 2*DrE_L$.

8. The method of manufacturing a semiconductor device according to claim 7, wherein:
the directional etch length $DrE_L$ satisfies a mathematical relationship [1]

$$2*DrE_L > CoreX_P \quad [1].$$

9. The method of manufacturing a semiconductor device according to claim 8, wherein:
the directional etch length $DrE_L$ satisfies a mathematical relationship [2]

$$2*DrE_L \geq (1.2)*CoreX_P \quad [2].$$

10. A system for manufacturing a semiconductor device, the system comprising:
a processor operable to
receive an integrated circuit design,
generate a first metal pattern (MX-1) for the integrated circuit design, the first metal pattern having a first metal pattern pitch ($MX\text{-}1_P$);
define a core grid of core locations having a core pitch ($CoreX_P$);
define a first subset of the core locations that will be used to form expanded core openings, the expanded core openings having an opening dimension of at least twice the first metal pattern pitch ($MX\text{-}1_P$);
define a second subset of the core locations that will be opened to form expanded core opening vias that will expose a portion of the first metal pattern (MX-1); and
generate a second metal pattern (MX) for the integrated circuit design, the second metal pattern having a second metal pattern pitch ($MX_P$), wherein portions of the second metal pattern align with a plurality of core locations.

11. The system for manufacturing a semiconductor device according to claim 10, the system further comprising:
a memory operable to store the integrated circuit design; and
a communications link between the memory and the processor.

12. The system for manufacturing a semiconductor device according to claim 11, further comprising:
determining a horizontal offset distance between the first and second metal patterns.

13. The system for manufacturing a semiconductor device according to claim 11, the system further comprising:
an etching apparatus for etching a core location to form an opened core; and
a directional etching (DrE) apparatus operable to enlarge the opened core along a first axis, thereby producing an expanded core opening.

14. The system for manufacturing a semiconductor device according to claim 13, the system further comprising:
a deposition apparatus operable to deposit a conductive material into the expanded core opening; and
a chemical-mechanical planarization (CMP) apparatus operable for removing an overburden of the conductive material and form the second metal pattern.

15. A semiconductor device comprising:
a first metal pattern (MX-1) having a first metal pattern pitch ($MX\text{-}1_P$) and being arranged along a plurality of parallel first axes;
an insulating layer over the first metal pattern;
a plurality of expanded core openings arranged along a second axis having a core pitch ($CoreX_P$) through the insulating layer, wherein the second axis is perpendicular to the first axes;
wherein a first subset of expanded core openings has a length $L_1$ along the second axis and a second subset of expanded core openings has a length $L_2$ along the second axis, the first and second subsets of expanded core openings satisfying a relationship $$L_1 \neq L_2$$

and
a conductive composition filling the expanded core openings forming a second metal pattern (MX).

16. The semiconductor device according to claim 15, wherein:
a ratio between $CoreX_P$ and $MX\text{-}1_P$ is an integer.

17. The semiconductor device according to claim 16, wherein:
the integer is not larger than 4.

18. The semiconductor device according to claim 15, wherein:
a ratio ($R_P$) between $CoreX_P$ and $MX\text{-}1_P$ is not an integer.

19. The semiconductor device according to claim 18, wherein:
the plurality of expanded core openings form an expanded core opening array; and
the expanded core opening array is shifted in a horizontal direction by an offset distance $D_O$ from the first metal pattern.

20. The semiconductor device according to claim 19, wherein:

CoreX$_P$, MX-1$_P$, and Do are each measured in an identical unit of measurement, wherein a value of expression [1]

$$(\text{CoreX}_P/\text{MX-1}_P) - (D_O/1 \text{ unit of measurement}) \qquad [1]$$

is an integer.

\* \* \* \* \*